US012345997B2

(12) United States Patent
Park et al.

(10) Patent No.: US 12,345,997 B2
(45) Date of Patent: Jul. 1, 2025

(54) LIGHT ROUTE CONTROL MEMBER AND DISPLAY DEVICE COMPRISING SAME

(71) Applicant: LG INNOTEK CO., LTD., Seoul (KR)

(72) Inventors: Jin Gyeong Park, Seoul (KR); Byung Sook Kim, Seoul (KR); Won Seok Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 531 days.

(21) Appl. No.: 17/758,854

(22) PCT Filed: Jan. 11, 2021

(86) PCT No.: PCT/KR2021/000332
§ 371 (c)(1),
(2) Date: Jul. 14, 2022

(87) PCT Pub. No.: WO2021/145619
PCT Pub. Date: Jul. 22, 2021

(65) Prior Publication Data
US 2023/0040154 A1 Feb. 9, 2023

(30) Foreign Application Priority Data

Jan. 14, 2020 (KR) .......................... 10-2020-0004829
Jan. 14, 2020 (KR) .......................... 10-2020-0004865

(51) Int. Cl.
*G02F 1/1681* (2019.01)
*G02F 1/13357* (2006.01)
(Continued)

(52) U.S. Cl.
CPC ...... *G02F 1/1681* (2019.01); *G02F 1/133606* (2013.01); *G02F 1/167* (2013.01); *G02F 1/1676* (2019.01)

(58) Field of Classification Search
CPC ..................................................... G02F 1/1681
See application file for complete search history.

(56) References Cited

U.S. PATENT DOCUMENTS 7,811,934 B2  10/2010  Jeong et al.
8,570,271 B2  10/2013  Lee et al.
(Continued)

FOREIGN PATENT DOCUMENTS

JP   2010-191125 A   9/2010
JP   2011-59653 A    3/2011
(Continued)

OTHER PUBLICATIONS

Office Action dated Jun. 27, 2023 in Japanese Application No. 2022-542059.
(Continued)

*Primary Examiner* — Joseph P Martinez
(74) *Attorney, Agent, or Firm* — Saliwanchik, Lloyd & Eisenschenk

(57) ABSTRACT

An optical path control member according to an embodiment comprises: a first substrate; a first electrode disposed on the upper part of the first substrate; a second substrate disposed on the first substrate; a second electrode disposed on the lower part of the second substrate; and a light conversion unit disposed between the first electrode and the second electrode. The light conversion unit includes a partition wall portion and a receiving portion that are alternately disposed. The receiving portion changes light transmittance according to the application of voltage. The partition wall portion includes a base partition wall portion and a separating partition wall portion. A plurality of pores are disposed in at least one of the base partition wall portion or the separating partition wall portion. The density per unit area of partition material in the separating partition wall portion is less than the density per unit area of partition material in the base partition wall portion.

20 Claims, 14 Drawing Sheets

(51) Int. Cl.
*G02F 1/167* (2019.01)
*G02F 1/1676* (2019.01)

(56) References Cited

U.S. PATENT DOCUMENTS

| | | | |
|---|---|---|---|
| 8,681,414 B2 | 3/2014 | Shin et al. | |
| 2010/0202035 A1 | 8/2010 | Noh et al. | |
| 2011/0063259 A1 | 3/2011 | Lee et al. | |
| 2011/0317248 A1 | 12/2011 | Lee et al. | |

FOREIGN PATENT DOCUMENTS

| | | | |
|---|---|---|---|
| JP | 2013-33125 A | 2/2013 | |
| JP | 5895677 B2 | 3/2016 | |
| JP | 2019-70732 A | 5/2019 | |
| KR | 10-0843552 B1 | 7/2008 | |
| KR | 10-2008-0090852 A | 10/2008 | |
| KR | 10-2011-0139943 A | 12/2011 | |
| KR | 10-2012-0009911 A | 2/2012 | |
| KR | 10-1241306 B1 | 3/2013 | |
| KR | 10-2015-0125051 A | 11/2015 | |
| KR | 10-2016-0096263 A | 8/2016 | |
| KR | 10-2018-0004879 A | 1/2018 | |
| KR | 20180004879 * | 1/2018 | ........... G02F 1/1335 |
| KR | 10-2018-0125803 A | 11/2018 | |

OTHER PUBLICATIONS

International Search Report dated Apr. 20, 2021 in International Application No. PCT/KR2021/000332.
Office Action dated May 10, 2024 in Korean Application No. 10-2020-0004829.
Office Action dated May 20, 2024 in Korean Application No. 10-2020-0004865.

* cited by examiner

LIGHT ROUTE CONTROL MEMBER AND DISPLAY DEVICE COMPRISING SAME

CROSS-REFERENCE TO RELATED APPLICATIONS

This application is the U.S. national stage application of International Patent Application No. PCT/KR2021/000332, filed Jan. 11, 2021, which claims the benefit under 35 U.S.C. § 119 of Korean Application Nos. 10-2020-0004829, filed Jan. 14, 2020; and 10-2020-0004865, filed Jan. 14, 2020; the disclosures of each of which are incorporated herein by reference in their entirety.

TECHNICAL FIELD

An embodiment relates to a light route control member, and a display device including the same.

BACKGROUND ART

A light-shielding film shields transmitting of light from a light source, and is attached to a front surface of a display panel which is a display device used for a mobile phone, a notebook, a tablet PC, a vehicle navigation device, a vehicle touch, etc., so that the light-shielding film adjusts a viewing angle of light according to an incident angle of light to express a clear image quality at a viewing angle needed by a user when the display transmits a screen.

In addition, the light-shielding film may be used for the window of a vehicle, building or the like to shield outside light partially to inhibit glare, or to inhibit the inside from being visible from the outside.

That is, the light-shielding film may be a light route control member that controls a movement path of light, block light in a specific direction, and transmit light in a specific direction. Accordingly, by controlling the light transmission angle by the light-shielding film, it is possible to control the viewing angle of the user.

Meanwhile, such a light-shielding film may be a light-shielding film that can always control the viewing angle regardless of the surrounding environment or the user's environment, and switchable light-shielding film that allows the user to turn on/off the viewing angle control according to the surrounding environment or the user's environment may be distinguished.

Such a switchable light-shielding film may be implemented by adding electrically moving particles to the receiving part in which the light conversion material is disposed, and changing the receiving part into a light transmitting part and a light blocking part by dispersion and aggregation of the particles.

Such a switchable light-shielding film may be implemented by adding electrically moving particles to the pattern part and changing the pattern part into a light transmitting portion and a light blocking portion by dispersion and aggregation of the particles.

The pattern part may be divided into a plurality of pattern parts by the partition wall part. That is, the partition wall part may be disposed between the plurality of pattern parts, respectively.

In this case, the partition wall part must have a certain dielectric characteristic for electrical connection between the pattern part and the electrode. However, there is a problem in that the leakage current increases in the direction of the partition wall part between the pattern parts due to the dielectric characteristics, and accordingly, the driving voltage is increased and the driving characteristics are reduced.

Accordingly, there is a need for an light route control member having a new structure capable of reducing the leakage current in the direction of the partition wall part as described above.

DISCLOSURE

Technical Problem

An embodiment is to provide an light route control member having improved driving characteristics, reliability, and visibility, and a display device including the same.

Technical Solution

A light route control member according to an embodiment includes: a first substrate; a first electrode disposed on the first substrate; a second substrate disposed on the first substrate; a second electrode disposed under the second substrate; and a light conversion part disposed between the first electrode and the second electrode, and the light conversion part comprises a partition wall part and a receiving part alternately arranged, and the light transmittance of the receiving part is changed according to application of a voltage, and the partition wall part includes a base partition wall part and a separation partition wall part, and a plurality of pores are disposed in at least one of the base partition wall part and the separation partition wall part, and a density per unit area of the partition wall material of the separation partition wall part is smaller than a density per unit area of the partition wall material of the base partition wall part

Advantageous Effects

The partition wall part of the light route control member according to the embodiment may have different densities per unit area between the separation partition wall part and the base partition wall part.

In detail, a plurality of pores is disposed inside the partition wall part, and the densities per unit area of the separation partition wall part and the base partition wall part may be different by the pores.

In this case, the porosity of the base partition wall part supporting the separation partition wall part and the separation partition wall part dividing the plurality of receiving parts may be different. Thereby, the driving characteristics, visibility, and reliability of the light route control member can be improved.

That is, the porosity inside the separation partition wall part disposed between the receiving parts is relatively increased compared to the porosity of the base partition wall part. Accordingly, it is possible to minimize the occurrence of leakage current to the separation partition wall part between the receiving parts due to the dielectric characteristics of the partition wall part.

Accordingly, it is possible to inhibit an increase in the driving voltage due to the leakage current, thereby the driving characteristics of the light route control member may be improved.

In addition, the strength of the base partition wall part may be secured by not disposing pores in the base partition wall part or by reducing the porosity. Accordingly, the reliability of the light route control member can be improved by stably supporting the separation partition wall part by the base partition wall part.

In addition, by making the pores disposed inside the separation partition wall part different for each region, that is, that is, by increasing the porosity of the light emitting portion more than the porosity of the incident portion, when light is emitted in the direction of the user, scattering and refraction by the pores may be inhibited.

Accordingly, when the user views the display, light scattering and refraction by the pores may be minimized, and thus, the visibility of the light route control member may be improved.

MODES OF THE INVENTION

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a light route control member according to an embodiment will be described with reference to drawings. The light route control member described below relates to a switchable light route control member that drives in various modes according to the movement of electrophoretic particles application of a voltage.

Figure 1:
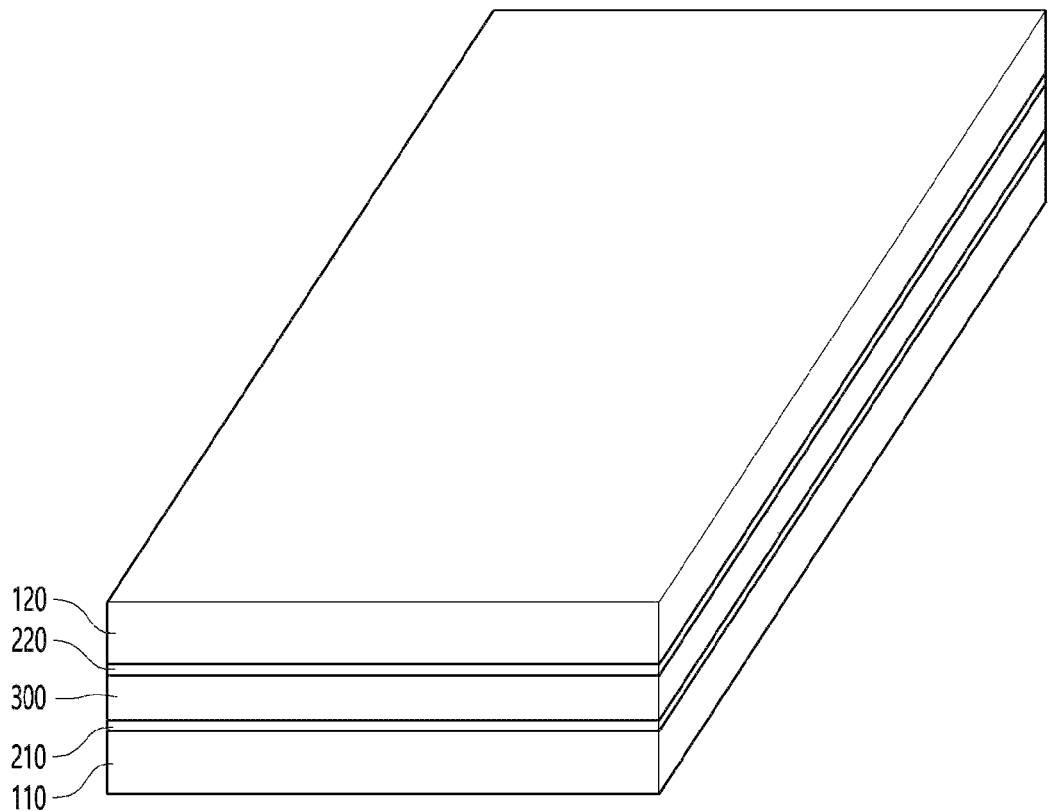
FIG. 1 is a view showing perspective view of a light route control member according to an embodiment.
Figure 2:
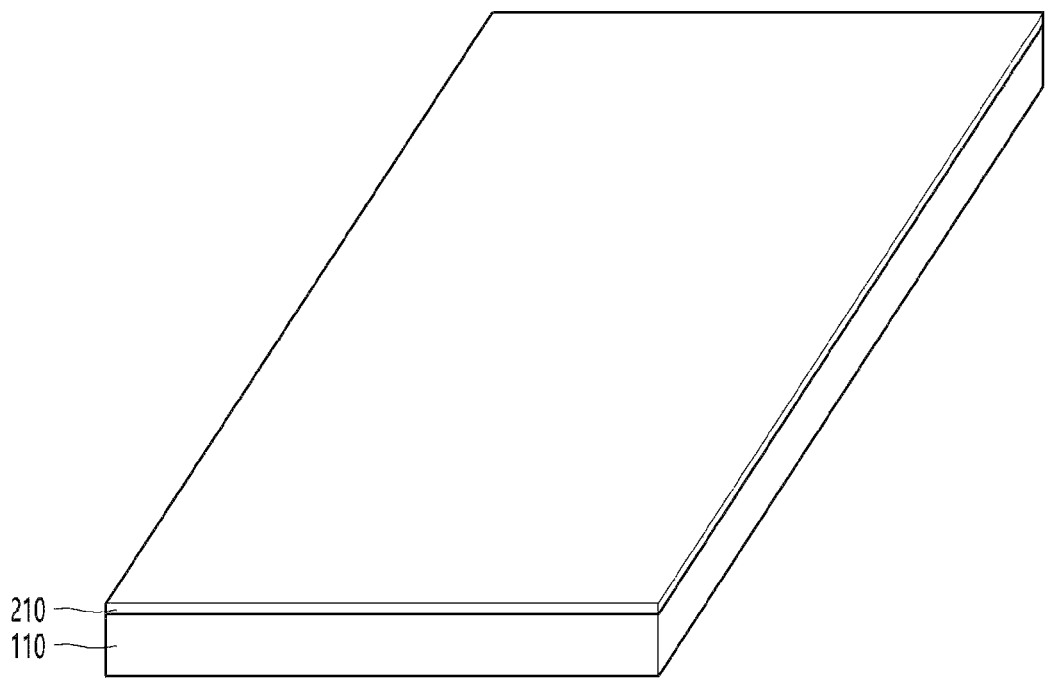
FIGS. 2 and 3 are views showing perspective views of a first substrate and a first electrode and a perspective view of a second substrate and a second electrode of the light route control member according to the embodiment, respectively.
Figure 3:
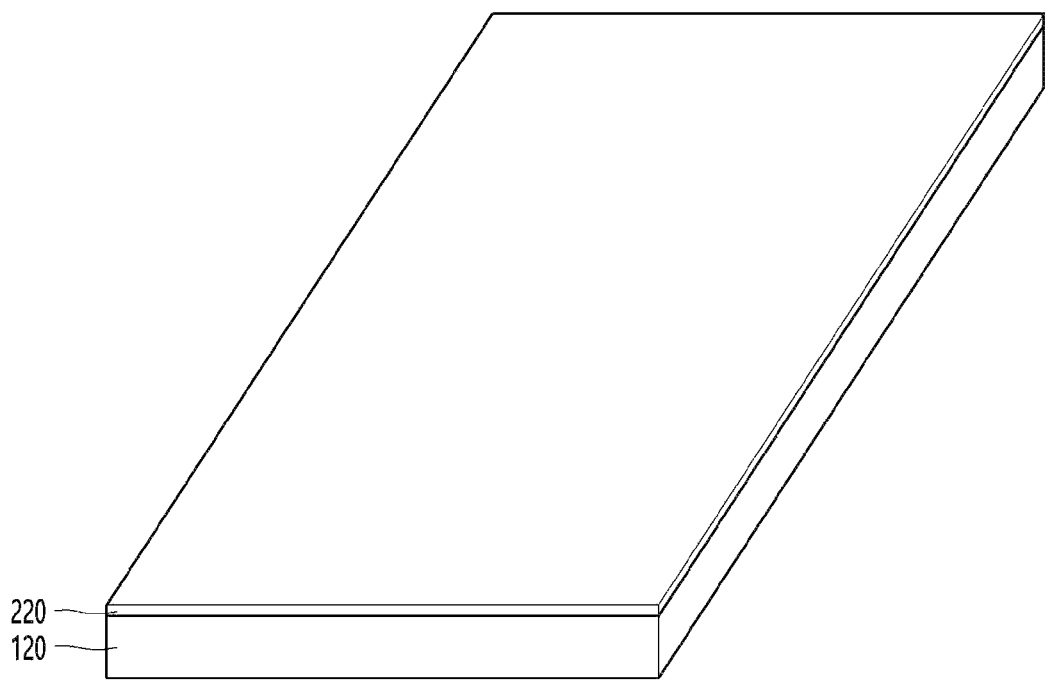

Referring to FIGS. 1 to 3, a light route control member according to an embodiment may include a first substrate 110, a second substrate 120, a first electrode 210, a second electrode 220, and a light conversion part 300.

The first substrate 110 may support the first electrode 210. The first substrate 110 may be rigid or flexible.

In addition, the first substrate 110 may be transparent. For example, the first substrate 110 may include a transparent substrate capable of transmitting light.

The first substrate 110 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the first substrate 110 may be a flexible substrate having flexible characteristics.

Further, the first substrate 110 may be a curved or bended substrate. That is, the light route control member including the first substrate 110 may also be formed to have flexible, curved, or bent characteristics. Accordingly, the light route control member according to the embodiment may be changed to various designs.

The first substrate 110 may have a thickness of 30 um to 80 um.

The first electrode 210 may be disposed on one surface of the first substrate 110. In detail, the first electrode 210 may be disposed on an upper surface of the first substrate 110. That is, the first electrode 210 may be disposed between the first substrate 110 and the second substrate 120.

The first electrode 210 may contain a transparent conductive material. For example, the first electrode 210 may contain a metal oxide such as indium tin oxide, indium zinc oxide, copper oxide, tin oxide, zinc oxide, titanium oxide, etc.

The first electrode 210 may be disposed on the first substrate 110 in a film shape. In detail, light transmittance of the first electrode 210 may be about 80% or more.

The first electrode 210 may have a thickness of about 0.1 um to about 0.5 um.

Alternatively, the first electrode 210 may contain various metals to realize low resistance. For example, the first electrode 210 may contain at least one metal of chromium (Cr), nickel (Ni), copper (Cu), aluminum (Al), silver (Ag), molybdenum (Mo). gold (Au), titanium (Ti), and alloys thereof.

The first electrode 210 may be disposed on the entire surface of one surface of the first substrate 110. In detail, the first electrode 210 may be disposed as a surface electrode on one surface of the first substrate 110. However, the embodiment is not limited thereto, and the first electrode 210 may be formed of a plurality of pattern electrodes having a predetermined pattern.

For example, the first electrode 210 may include a plurality of conductive patterns. In detail, the first electrode 210 may include a plurality of mesh lines intersecting each other and a plurality of mesh openings formed by the mesh lines.

Accordingly, even though the first electrode 210 contains a metal, visibility may be improved because the first electrode is not visible from the outside. In addition, the light transmittance is increased by the openings, so that the brightness of the light route control member according to the embodiment may be improved.

The second substrate 120 may be disposed on the first substrate 110. In detail, the second substrate 120 may be disposed on the first electrode 210 on the first substrate 110.

The second substrate 120 may contain a material capable of transmitting light. The second substrate 120 may contain a transparent material. The second substrate 120 may contain a material the same as or similar to that of the first substrate 110 described above.

For example, the second substrate 120 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the second substrate 120 may be a flexible substrate having flexible characteristics.

Further, the second substrate 120 may be a curved or bended substrate. That is, the light route control member including the second substrate 120 may also be formed to have flexible, curved, or bent characteristics. Accordingly, the light route control member according to the embodiment may be changed to various designs.

The second substrate 120 may have a thickness of 30 mm to 80 mm.

The second electrode 220 may be disposed on one surface of the second substrate 120. In detail, the second electrode 220 may be disposed on a lower surface of the second substrate 120. That is, the second electrode 220 may be disposed on a surface on which the second substrate 120 faces the first substrate 110. That is, the second electrode 220 may be disposed facing the first electrode 210 on the first substrate 110. That is, the second electrode 220 may be disposed between the first electrode 210 and the second substrate 120.

The second electrode 220 may contain a transparent conductive material. For example, the second electrode 220 may contain a metal oxide such as indium tin oxide, indium zinc oxide, copper oxide, tin oxide, zinc oxide, titanium oxide, etc.

The second electrode 220 may be disposed on the first substrate 110 in a film shape. In addition, the light transmittance of the second electrode 220 may be about 80% or more.

The second electrode 220 may have a thickness of about 0.1 um to about 0.5 um.

Alternatively, the second electrode 220 may contain various metals to realize low resistance. For example, the second electrode 220 may contain at least one metal of chromium (Cr), nickel (Ni), copper (Cu), aluminum (Al), silver (Ag), molybdenum (Mo). gold (Au), titanium (Ti), and alloys thereof.

The second electrode 220 may be disposed on the entire surface of one surface of the second substrate 120. In detail, the second electrode 220 may be disposed as a surface electrode on one surface of the second substrate 120. However, the embodiment is not limited thereto, and the second electrode 220 may be formed of a plurality of pattern electrodes having a predetermined pattern.

For example, the second electrode 220 may include a plurality of conductive patterns. In detail, the second electrode 220 may include a plurality of mesh lines intersecting each other and a plurality of mesh openings formed by the mesh lines.

Accordingly, even though the second electrode 220 contains a metal, visibility may be improved because the second electrode 220 is not visible from the outside. In addition, the light transmittance is increased by the openings, so that the brightness of the light route control member according to the embodiment may be improved.

The light conversion part 300 may be disposed between the first substrate 110 and the second substrate 120. In detail, the light conversion part 300 may be disposed between the first electrode 210 and the second electrode 220.

An adhesive layer 400 may be disposed at least one of between the light conversion part 300 and the first substrate 110 and between the light conversion part 300 and the second substrate 120, and the first substrate 110, the second substrate 120, and the light conversion part 300 may be adhered to each other by the adhesive layer 400.

Figure 4:
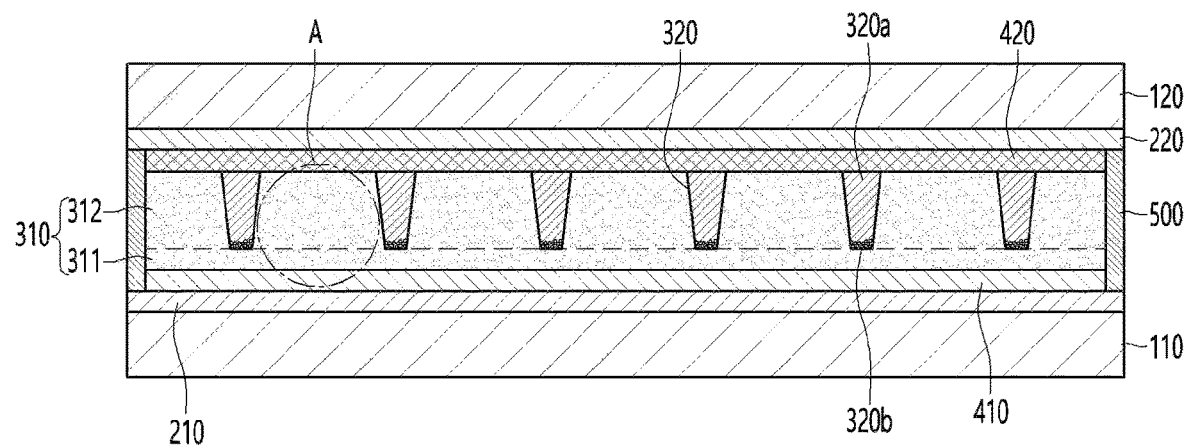
FIGS. 4 and 5 are views showing cross-sectional views of the light route control member according to the embodiment.
Figure 5:
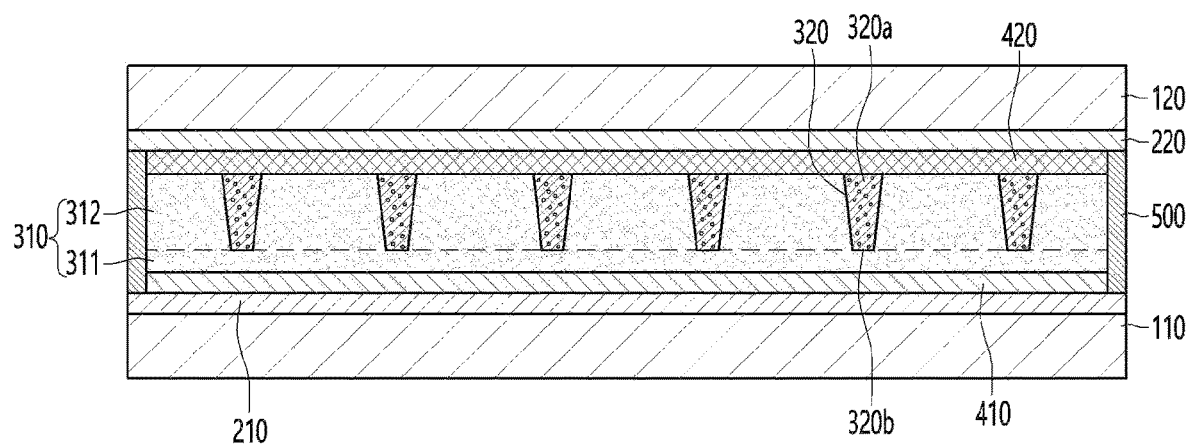

Referring to FIGS. 4 and 5, a buffer layer 410 for improving adhesion between the light conversion part 300 and the first electrode 210 is disposed between the light conversion part 300 and the first electrode 210, and the light conversion part 300 and the first electrode 210, which are different materials, may be easily bonded through the buffer layer 410.

In addition, an adhesive layer 420 is disposed between the second electrode 220 and the light conversion part 300, thereby the light conversion part 300 and the second electrode 220 may be adhered. The light conversion part 300 may include a partition wall part 310 and a receiving part 320.

The partition wall part 310 may be defined as a partition wall region that partitions the receiving part. That is, the partition wall part 310 is a partition wall region partitioning a plurality of receiving parts. And the receiving part 320 may be defined as a region that changes into a light blocking part and a light transmitting part according to the application of a voltage.

The partition wall part 310 and the receiving part 320 may be alternately disposed with each other. The partition wall part 310 and the receiving part 320 may be disposed to have different widths. For example, the width of the partition wall portion 310 may be greater than the width of the receiving part 320.

The partition wall part 310 and the receiving part 320 may be alternately disposed with each other. In detail, the partition wall part 310 and the receiving part 320 may be alternately disposed with each other. That is, each of the partition wall portions 310 may be disposed between the receiving parts 320 adjacent to each other, and each of the receiving parts 320 may be disposed between the adjacent partition wall portions 310.

The partition wall part 310 may contain a transparent material. The partition wall part 310 may contain a material that may transmit light.

The partition wall part 310 may contain a resin material. The partition wall part 310 may contain a photo-curable resin material. As an example, the partition wall part 310 may contain a UV resin or a transparent photoresist resin. Alternatively, the partition wall part 310 may contain urethane resin or acrylic resin.

The partition wall part 310 may transmit light incident on any one of the first substrate 110 and the second substrate 120 toward another substrate.

For example, in FIGS. 4 and 5, a light is emitted from the upper portion of the second substrate 120, and the light may pass through the light route control member to move downward of the first substrate 110.

A sealing part 500 sealing the light route control member may be disposed on a side surface of the partition wall part, and a side surface of the light conversion part 300 may be sealed by the sealing part.

The receiving part 320 may include a dispersion 320a and light conversion particles 320b. That is, a light conversion material including the dispersion 320a and the light conversion particles 320b may be disposed inside the receiving part 320. In detail, the dispersion 320a is injected into the receiving part 320 and filled, and a plurality of light conversion particles 320b may be dispersed in the dispersion 320a.

The dispersion 320a may be a material for dispersing the light conversion particles 320b. The dispersion 320a may contain a transparent material. The dispersion 320a may contain a non-polar solvent. In addition, the dispersion 320a may contain a material capable of transmitting light. For example, the dispersion 320a may include at least one of a halocarbon-based oil, a paraffin-based oil, and isopropyl alcohol.

The light conversion particles 320b may be disposed to be dispersed in the dispersion 330a. In detail, the plurality of light conversion particles 320b may be disposed to be spaced apart from each other in the dispersion 330a.

The light conversion particles 320b may include a material capable of absorbing light. That is, the light conversion particle 320b may be a light absorbing particle. The light conversion particle 320b may have a color. For example, the light conversion particles 320b may have a black-based color. For example, the light conversion particles 320b may include carbon black particles.

The surface of the light conversion particle 320b may be charged. Accordingly, according to the application of the voltage, the light conversion particles 320b may move in one direction.

The light transmittance of the receiving part 320 may be changed by the light conversion particles 320b. In detail, the receiving part 320 may be changed into a light blocking part and a light transmitting part by changing the light transmittance by the light conversion particles 320b. That is, the receiving part 320 may change the transmittance of the light passing through the receiving part 320 by dispersion and aggregation of the light conversion particles 320b disposed therein in the dispersion 320a.

For example, the light path member according to the embodiment may be change from the first mode to the second mode or from the second mode to the first mode by a voltage applied to the first electrode 210 and the second electrode 220.

In detail, in the light route control member 1000 according to the embodiment, the receiving part 320 becomes the light blocking part in the first mode, and light of a specific angle may be blocked by the receiving part 320. That is, a viewing angle of the user viewing from the outside may be narrowed.

In addition, in the light route control member 1000 according to the embodiment, the receiving part 320 becomes the light transmitting part in the second mode, and in the light route control member according to the embodiment, light may be transmitted through both the partition wall part 310 and the receiving part 320. That is, the viewing angle of the user viewing from the outside may be widened.

Switching from the first mode to the second mode, that is, the conversion of the receiving part 320 from the light blocking part to the light transmitting part may be realized by movement of the light conversion particles 320b of the receiving part 320. That is, the light conversion particles 320b have electric charges on their surface, and may move in the direction of the first electrode 210 or the second electrode 220 by an applied voltage or by characteristics of the charge. That is, the light conversion particles 320b may be electrophoretic particles.

In detail, the receiving part 320 may be electrically connected to the first electrode 210 and the second electrode 220.

In this case, when a voltage is not applied to the light route control member from the outside, the light conversion particles 320b of the receiving part 320 are uniformly dispersed in the dispersion 330a, and light may be blocked by the light conversion particles in the receiving part 320. Accordingly, in the first mode, the receiving part 320 may be driven as the light blocking part.

Alternatively, when a voltage is applied to the light route control member from the outside, the light conversion particles 320b may move. For example, the light conversion particles 320b may move toward one end or the other end of the receiving part 320 by a voltage transmitted through the first electrode 210 and the second electrode 220. That is, the light conversion particles 320b may move from the receiving part 320 toward the first electrode or the second electrode.

In detail, when a voltage is applied to the first electrode 210 and/or the second electrode 220, an electric field is formed between the first electrode 210 and the second electrode 220. And, the light conversion particles 320b in a negatively charged state can be moved in the direction of the positively charged electrode among the first electrode 210 and the second electrode 220 using the dispersion 320a as a medium.

In detail, when a voltage is applied to the first electrode 210 and/or the second electrode 220, an electric field is formed between the first electrode 210 and the second electrode 220, and the charged carbon black, that is, the light conversion particles may be moved toward a positive electrode of the first electrode 210 and the second electrode 220 using the dispersion 320a as a medium.

That is, when the voltage is applied to the first electrode 210 and/or the second electrode 220, as shown in FIG. 4, the light conversion particles 320b may be moved toward the first electrode 210 in the dispersion 330a. That is, the light conversion particles 320b are moved in one direction, and the receiving part 320 may be driven as the light transmitting part.

In addition, when the voltage is not applied to the first electrode 210 and/or the second electrode 220, as shown in FIG. 5, the light conversion particles 320b may be uniformly dispersed in the dispersion 320a to drive the receiving part 30202 as the light blocking part.

Accordingly, the light route control member according to the embodiment may be driven in two modes according to a user's surrounding environment. That is, when the user requires light transmission only at a specific viewing angle, the receiving unit is driven as the light blocking part, or in an environment in which the user requires high brightness, a voltage may be applied to drive the receiving unit as the light transmitting part.

Therefore, since the light route control member according to the embodiment may be implemented in two modes according to the user's requirement, the light route control member may be applied regardless of the user's environment.

Meanwhile, in order to implement the improved characteristics of the light conversion part, the partition wall part 310 may be formed to have a different density for each area of the partition wall part 310.

In detail, the partition wall part 310 may include a base partition wall part 311 disposed on the first electrode 210 and a separation partition wall part 312 disposed on the base partition wall part 311. In detail, the partition wall part 310 may include a base partition wall part 311 disposed below the receiving part 320 and a separation partition wall part 312 disposed on the base partition wall part 311.

The base partition wall part 311 and the separation partition wall part 312 may be formed to have different widths. In detail, the width of the base partition wall part 311 may be greater than the width of the separation partition wall part 312. For example, the partition wall part 310 may be formed in a shape in which the width decreases while extending from the base partition wall part 311 to the separation partition wall part 312.

The partition wall part 310 may have a dielectric characteristic to apply a voltage to the receiving part 320. Accordingly, since the base partition wall part 311 has dielectric properties, even when the receiving part 320 and the first electrode 210 disposed between the partition wall parts 310 are disposed to be spaced apart from each other, a voltage may be applied to the inside of the receiving part 320.

On the other hand, since the separation partition wall part 310 also has dielectric properties, there is a problem in that a current is leaked through the separation partition wall part 310 between the receiving parts 320, thereby increasing a driving voltage.

Accordingly, as the light route control member according to the embodiment arranges a plurality of pores in the partition wall part 310, and the partition wall part is formed to have a different density for each region, the above problems can be solved.

Hereinafter, various embodiments in which a plurality of pores disposed inside the partition wall part 310 are disposed will be described. In the following description, the embodiment, which the display panel is disposed on the second substrate 120 and light emitted from a light source of the display panel moves from the second substrate 120 to the first substrate 110 and the user recognizes the display through the first substrate 110, will be mainly described.

FIGS. 6 to 9 are views illustrating enlarged views of partition wall parts according to various embodiments.

Figure 6:
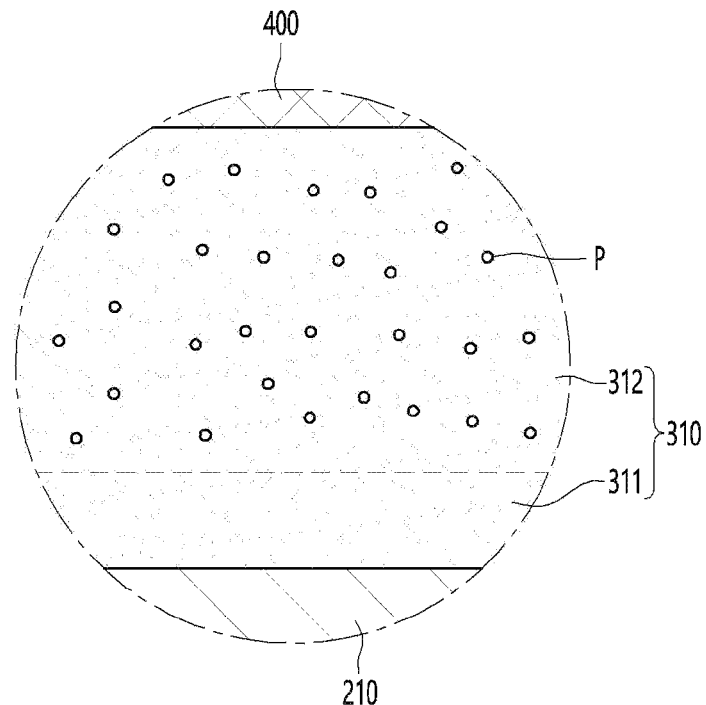
FIG. 6 is an enlarged view of area A of FIG. 4.

Referring to FIG. 6, a plurality of pores P may be disposed in the partition wall part 310. The pores P may be formed of an air layer formed inside the material forming the partition wall part in the partition wall part 310. That is, the pores P may include air.

The pores P may be disposed only in a specific region inside the partition wall part 310. In detail, the pores (P) are disposed only inside the separation partition wall part (312), and may not be disposed inside the base partition wall part 311.

Due to the pores P, the partition wall part 310 may have a different density for each area. In detail, the density per unit area of the base partition wall part 311 may be greater than the density per unit area of the separation partition wall part 312 due to the pores P. Here, the density per unit area may be defined as the density per unit area of the partition wall part material. That is, by measuring the area of the partition wall part material in the unit area, the density per unit area of the partition wall part material in the base partition wall part 311 and the separation partition wall part 312 can be measured.

That is, the separation partition wall part 312 may have a relatively reduced density per unit area due to the pores P disposed therein.

The pores P may be disposed at a porosity of a certain size with respect to the entire separation partition wall part 312. In detail, the pores P may be disposed at a porosity of 0.5% to 50% with respect to the entire separation partition wall part 312. Also, the pores P may be disposed at a porosity of 0.1% to 25% based on the entirety of the partition wall part 310.

When the pores P are included in a porosity of less than 0.5% with respect to the entire separation partition wall part 312, since the dielectric characteristic of the separation partition wall part 312 is not sufficiently reduced, a leakage current may increase from the receiving part in the direction of the separation partition wall part.

In addition, when the pores P are included in a porosity of more than 50% with respect to the entire separation partition wall part 312, the light loss may increase due to scattering and refraction of light passing through the separation partition wall part 312 due to the pores of the separation partition wall part 312.

When the light route control member is driven, the pores P disposed in the separation partition wall part 312 may reduce leakage of current from area between the receiving part in the direction of the separation partition wall part 312.

That is, by reducing the dielectric properties of the separation partition wall part 312 by the pores P, it is possible to minimize leakage of current from area between the receiving part in the direction of the separation partition wall part 312.

Accordingly, since the driving voltage of the light route control member is reduced, it is possible to drive the light route control member at a low voltage, thereby improving the driving characteristics.

In addition, since the pores P are disposed only in the separation partition wall part and not in the base partition wall part, the support force of the partition wall part may be secured.

That is, since pores that reduce the support force are not disposed in the base partition wall part having a thick width of the partition wall part, the strength of the base partition wall part is maintained and the supporting force of the separation partition wall part disposed on the partition wall part can be secured.

Figure 7:
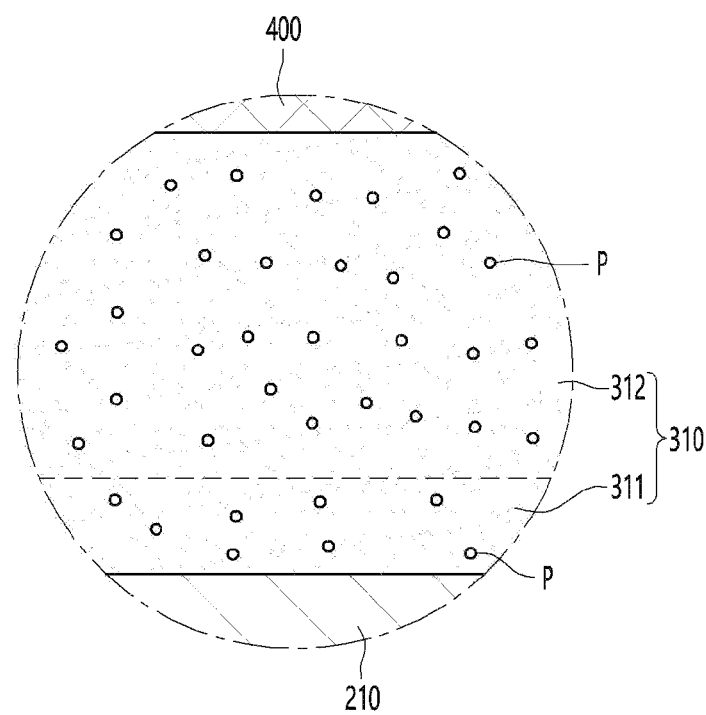
FIG. 7 is an enlarged view of area A of FIG. 4.

Referring to FIG. 7, a plurality of pores P may be disposed in the partition wall part 310. The pores P may be formed of an air layer formed inside the material forming the partition wall part in the partition wall part 310. That is, the pores P may include air.

The pores P may be arranged in different volumes for each area within the partition wall part 310.

In detail, the pores P may be disposed in both the base partition wall part 311 and the separation partition wall part 312.

In this case, a volume per unit area of the pores P of the base partition wall part 311 and a volume per unit area of the pores P of the separation partition wall part 312 may be different from each other. In detail, the volume per unit area of the pores P of the base partition wall part 311 may be smaller than the volume per unit area of the pores P of the separation partition wall part 312.

That is, the pores P may be disposed relatively more in the separation partition wall part 312 than in the base partition wall part 311.

The amount of the pores P may be controlled when forming the partition wall part 310. In detail, after filling the inside of the mold corresponding to the shape of the partition wall part with a resin material forming the partition wall part, pores formed during the filling process are artificially removed before releasing the mold. Accordingly, the pores P inside the partition wall part can be arranged differently for each region.

In this case, the pores P of the base partition wall part 311 may be remain by a certain volume. In detail, the pores P may remain within a range capable of maintaining the supporting force of the base partition wall part 311.

Accordingly, when disposing the partition wall part, some pores remain enough to maintain the support force of the partition wall part without removing all the pores of the base partition wall part Accordingly, it is possible to inhibit a decrease in process efficiency due to the pore removal process.

Due to the pores P, the partition wall part 310 may have a different density for each area. In detail, the density per unit area of the base partition wall part 311 may be greater than the density per unit area of the separation partition wall part 312 due to the pores P.

That is, the separation partition wall part 312 may have a relatively reduced density per unit area due to the pores P disposed therein.

The pores P may be disposed at a porosity of a certain size with respect to the entire separation partition wall part 312. In detail, the pores P may be disposed at a porosity of 0.5% to 50% with respect to the entire separation partition wall part 312. Also, the pores P may be disposed at a porosity of 0.1% to 25% based on the entirety of the partition wall part 310.

When the pores P are included in a porosity of less than 0.5% with respect to the entire separation partition wall part 312, since the dielectric properties of the separation partition wall part 312 are not sufficiently reduced, a leakage current may increase from the receiving part in the direction of the separation partition wall part.

In addition, when the pores P are included in a porosity of more than 50% with respect to the entire separation partition wall part 312, the light loss may increase due to scattering and refraction of light passing through the separation partition wall part 312 due to the pores of the separation partition wall part 312.

The pores P disposed in the separation partition wall part 312 may reduce current leakage between the receiving parts in the direction of the separation partition wall part 312 when the light route control member is driven.

That is, by reducing the dielectric properties of the separation partition wall part 312 by the pores P, current leakage between the receiving parts in the direction of the separation partition wall part 312 may be minimized.

Accordingly, by reducing the driving voltage of the light route control member, it is possible to drive the light route control member at a low voltage, thereby improving driving characteristics.

Figure 8:
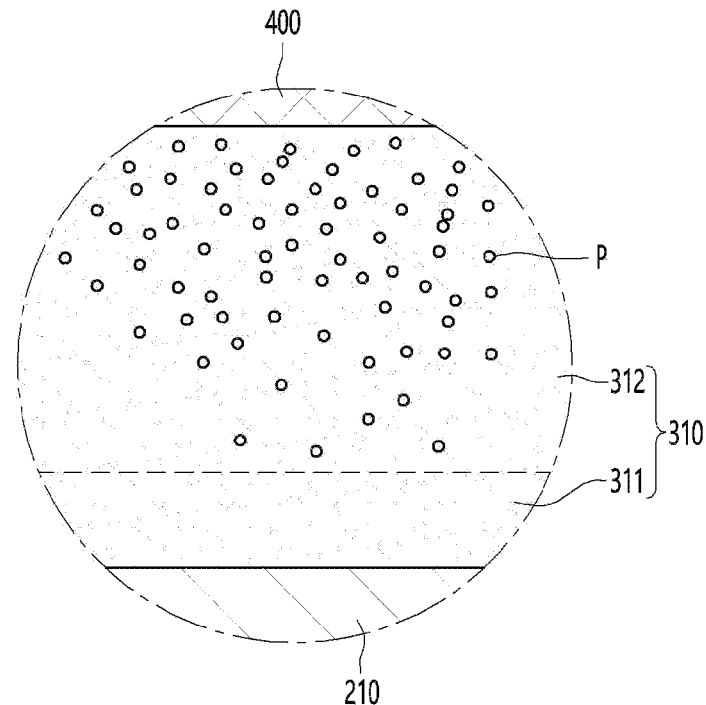
FIG. 8 is an enlarged view of area A of FIG. 4.

Referring to FIG. 8, a plurality of pores P may be disposed in the partition wall part 310. The pores P may be formed of an air layer formed inside the material forming the partition wall part in the partition wall part 310. That is, the pores P may include air.

The pores P may be disposed only in a specific region inside the partition wall part 310. In detail, the pores P may be disposed only inside the separation partition wall part 312, and may not be disposed inside the base partition wall part 311.

Due to the pores P, the partition wall part 310 may have a different density for each area. In detail, the density per unit area of the base partition wall part 311 may be greater than the density per unit area of the separation partition wall part 312 due to the pores P.

That is, the separation partition wall part 312 may have a relatively reduced density per unit area due to the pores P disposed therein.

The pores P may be disposed at a porosity of a certain size with respect to the entire separation partition wall part 312. In detail, the pores P may be disposed at a porosity of 0.5% to 50% with respect to the entire separation partition wall part 312.

When the pores P are included in a porosity of less than 0.5% with respect to the entirety of the separation partition wall part 312, the dielectric properties of the separation partition wall part 312 are not sufficiently reduced. Accordingly, a leakage current may be increased in a direction from the receiving part to the separation partition wall part.

In addition, when the pores P are included in a porosity exceeding 50% of the total of the separation partition wall part 312, a light loss may increase because scattering and refraction of light passing through the separation partition wall part 312 may occur due to the pores of the separation partition wall part 312.

The pores P may be disposed in different amounts for each area in the separation partition wall part 312. That is, the pores P may be arranged in different volumes for each area in the separation partition wall part 312.

In detail, the amount of the pores P, that is, the volume of the pores P, may decrease while extending in the direction of the base partition wall part 311 inside the separation partition wall part 312.

Also, the amount of the pores P, that is, the volume of the pores P, may decrease while extending in a direction in which the light moves. That is, the amount of the pores P, that is, the volume of the pores P, may decrease while extending in the movement direction of the light.

The pores P disposed in the separation partition wall part 312 may reduce current leakage between the receiving parts in the direction of the separation partition wall part 312 when the light route control member is driven.

That is, by reducing the dielectric properties of the separation partition wall part 312 by the pores P, current leakage between the receiving parts in the direction of the separation partition wall part 312 may be minimized.

Accordingly, by reducing the driving voltage of the light route control member, it is possible to drive the light route control member at a low voltage, thereby improving driving characteristics.

In addition, since the pores P are disposed only in the separation partition wall part and not in the base partition wall part, the support force of the partition wall part may be secured.

That is, since pores that reduce the supporting force of the base partition wall part are not disposed in the base partition wall part having a thick width, the strength of the base partition wall part is maintained and the supporting force of the separation partition wall part disposed on the partition wall part can be secured.

In addition, the amount of the pores (P), that is, the volume of the pores (P) is arranged differently for each area inside the partition wall part. Accordingly, it is possible to minimize the scattering of the light emitted toward the user. That is, the amount of the pores (P), that is, the volume of the pores (P) based on the movement direction of the light decreases while extending in the movement direction of the light. Accordingly, it is possible to minimize scattering of light moving in the user direction, thereby improving the frontal luminance of the light.

Accordingly, when the user views the display through the light route control member, a clearer display may be viewed by the improved front luminance.

Meanwhile, in FIG. 8, it has been mainly described that the pores are not disposed in the base partition wall part, but the embodiment is not limited, and pores maintaining the strength of the partition wall part may be included in the partition wall part as shown in FIG. 7.

Accordingly, when disposing the partition wall part, some pores remain sufficient to maintain the support force of the partition wall part without removing all the pores of the base partition wall part, thereby inhibiting a decrease in process efficiency due to the pore removal process.

Figure 9:
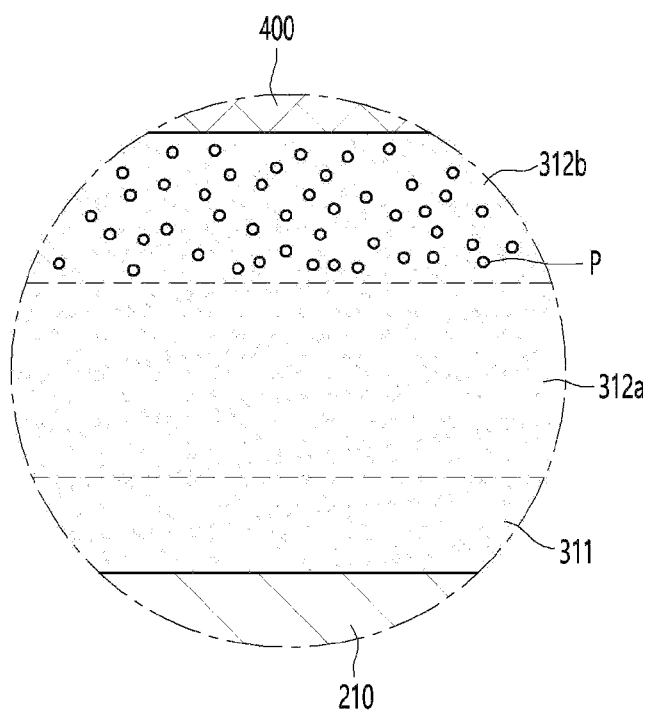
FIG. 9 is an enlarged view of area A of FIG. 4.

Referring to FIG. 9, a plurality of pores P may be disposed in the partition wall part 310. The pores P may be formed of an air layer formed inside the material forming the partition wall part in the partition wall part 310. That is, the pores P may include air.

The pores P may be disposed only in a specific region inside the partition wall part 310. In detail, the pores P may be disposed only inside the separation partition wall part 312, and may not be disposed inside the base partition wall part 311.

Due to the pores P, the partition wall part 310 may have a different density for each area. In detail, the density per unit area of the base partition wall part 311 may be greater than the density per unit area of the separation partition wall part 312 due to the pores P.

That is, the separation partition wall part 312 may have a relatively reduced density per unit area due to the pores P disposed therein.

The pores P may be disposed at a porosity of a certain size with respect to the entire separation partition wall part 312. In detail, the pores P may be disposed at a porosity of 0.5% to 50% with respect to the entire separation partition wall part 312. Also, the pores P may be disposed at a porosity of 0.1% to 25% based on the entirety of the partition wall part 310.

When the pores P are included in a porosity of less than 0.5% with respect to the entirety of the separation partition wall part 312, the dielectric properties of the separation partition wall part 312 are not sufficiently reduced. Accordingly, a leakage current may be increased in a direction from the receiving part to the separation partition wall part.

In addition, when the pores P are included in a porosity exceeding 50% of the total of the separation partition wall part 312, a light loss may increase due to scattering and refraction of light passing through the separation partition wall part 312 due to the pores of the partition wall part 312.

The pores P may be disposed in a partial area inside the separation partition wall part 312. In detail, the pores P may be disposed only in the direction of the second substrate 120 inside the separation partition wall part 312.

For example, the separation partition wall part 312 may be defined a first separation partition wall part 312*a* in a direction close to the first substrate 110 and a second separation partition wall part 312*b* in a direction close to the second substrate 120, and the pores P may be disposed only in the second separation partition wall part 312*b*.

That is, the pores P may be disposed only in the second separation partition wall part 312*b* close to an exit portion of the light emitted from the display panel.

The first separation partition wall part 312*a* and the second separation partition wall part 312*b* may be disposed to have different thicknesses. In detail, the thickness of the second separation partition wall part 312*b* may be less than or equal to the thickness of the first separation partition wall part 312*a*.

The second separation partition wall part 312*b* may have a thickness of 20% to 50% of the total thickness of the separation partition wall part.

The pores P disposed in the separation partition wall part 312 may reduce current leakage between the receiving parts in the direction of the separation partition wall part 312 when the light route control member is driven.

That is, by reducing the dielectric properties of the separation partition wall part 312 by the pores P, current leakage between the receiving parts in the direction of the separation partition wall part 312 may be minimized.

Accordingly, by reducing the driving voltage of the light route control member, it is possible to drive the light route control member at a low voltage, thereby improving driving characteristics.

In addition, since the pores P are disposed only in the separation partition wall part and not in the base partition wall part, the support force of the partition wall part may be secured.

That is, since pores that reduce the supporting force of the base partition wall part are not disposed in the base partition wall part having a thick width, the strength of the base partition wall part is maintained and the supporting force of the separation partition wall part disposed on the base partition wall part can be secured.

In addition, since the pores P are disposed only in a direction close to the light exit portion and not in a direction close to the light incidence portion, scattering of light emitted from the incidence portion toward the user may be minimized. That is, by arranging the pores P only on the exit portion part based on the movement direction of light, scattering of light from the incidence portion can be minimized and the frontal luminance of the light can be improved from the incident portion.

Accordingly, when the user views the display through the light route control member, a clearer display may be viewed by the improved front luminance.

Meanwhile, in FIG. 9, it has been mainly described that pore are not disposed in the base partition wall part, but the embodiment is not limited, and as shown in FIG. 7, the base partition wall part may include pores sufficient to maintain the strength of the partition wall part.

Accordingly, when disposing the partition wall part, some pores remain sufficient to maintain the support force of the partition wall part without removing all the pores of the base partition wall part, thereby inhibiting a decrease in process efficiency due to the pore removal process.

The partition wall part of the light route control member according to the embodiment may have different densities per unit area of the partition wall material of the separation partition wall part and the base partition wall part.

In detail, a plurality of pores is disposed inside the partition wall part, and the densities per unit area of the separation partition wall part and the base partition wall part may be different by the pores.

In this case, the driving characteristics, visibility, and reliability of the light route control member may be improved by varying the porosity of the base partition wall part supporting the separation partition wall part and the separation partition wall part dividing the receiving part into a plurality of receiving parts.

That is, the porosity is relatively increased in the separation partition wall part disposed between the receiving parts compared to the base partition wall part, and leakage current to the separation partition wall part between the receiving parts can be minimized due to the dielectric properties of the partition wall part.

Accordingly, it is possible to inhibit an increase in the driving voltage due to the leakage current, thereby improving the driving characteristics of the light route control member.

In addition, the base partition wall part may not include pores or have a reduced porosity. Accordingly, the strength of the base partition wall part can be secured. Accordingly, the reliability of the light route control member can be improved by stably supporting the separation partition wall part by the base partition wall part.

In addition, the pores disposed inside the separation partition wall part may be different for each region, that is, the porosity of the light emitting part may be increased more than the porosity of the light incident part. Accordingly, when light is emitted in the direction of the user, scattering and refraction by the pores can be inhibited.

Accordingly, when the user views the display, light scattering and refraction by the pores may be minimized, and thus, the visibility of the light route control member may be improved.

FIGS. 10 to 13 are views illustrating other cross-sectional views of a light route control member according to an embodiment.

Figure 10:
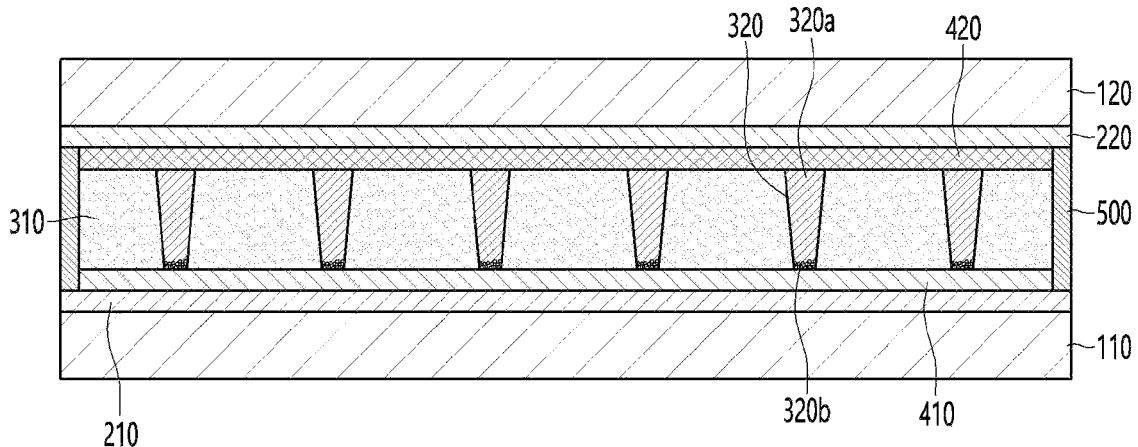
FIGS. 10 to 13 are views showing other cross-sectional views of the light route control member according to the embodiment.
Figure 11:
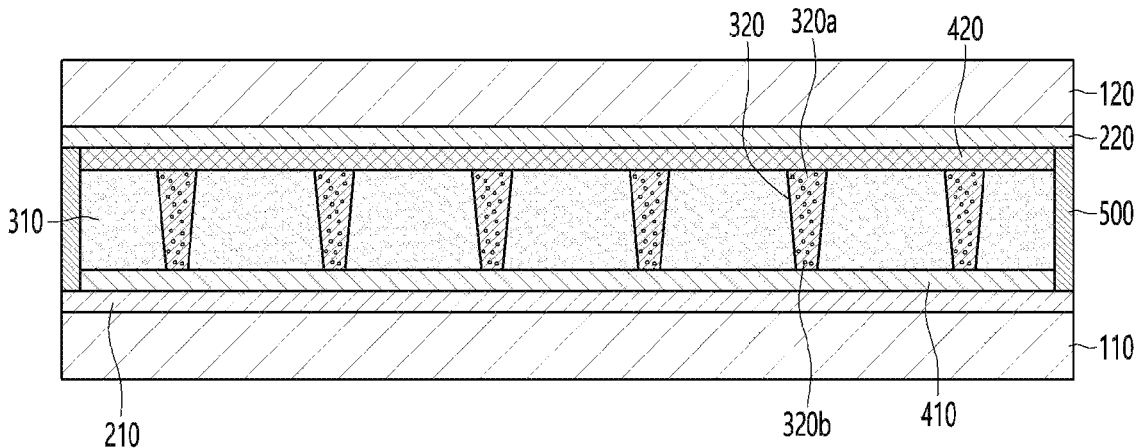

Referring to FIGS. 10 and 11, in the light route control member according to the embodiment, the receiving part 320 may be disposed in contact with the electrode differently from FIGS. 4 to 7.

For example, the receiving part 320 may be disposed in direct contact with the first electrode 210.

Accordingly, since the first electrode 210 and the receiving part 320 are not spaced apart and are arranged in direct contact with each other, the voltage applied from the first electrode 210 may be easily transferred to the receiving part 320.

Accordingly, it is possible to improve the moving speed of the light conversion particle 10 inside the receiving part 320 to improve the driving characteristics of the light route control member.

Figure 12:
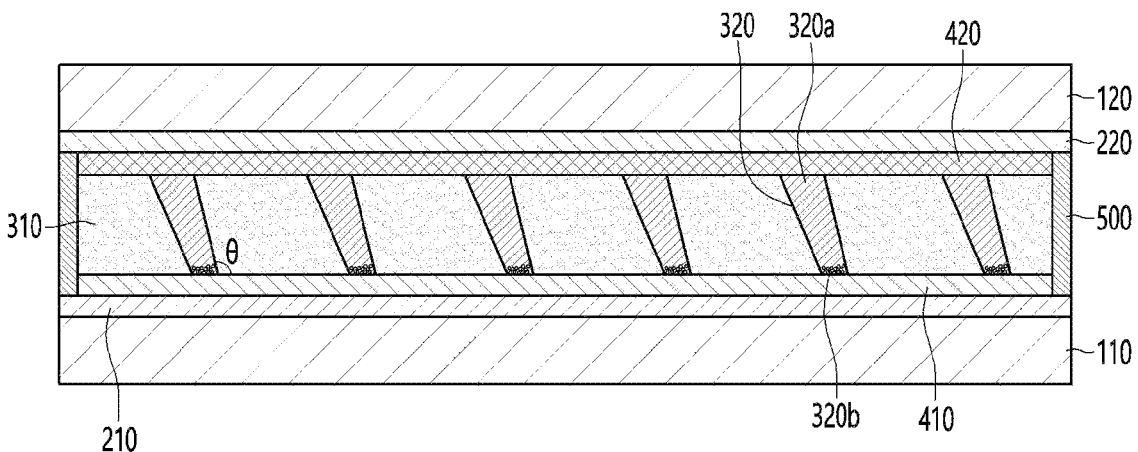
Figure 13:
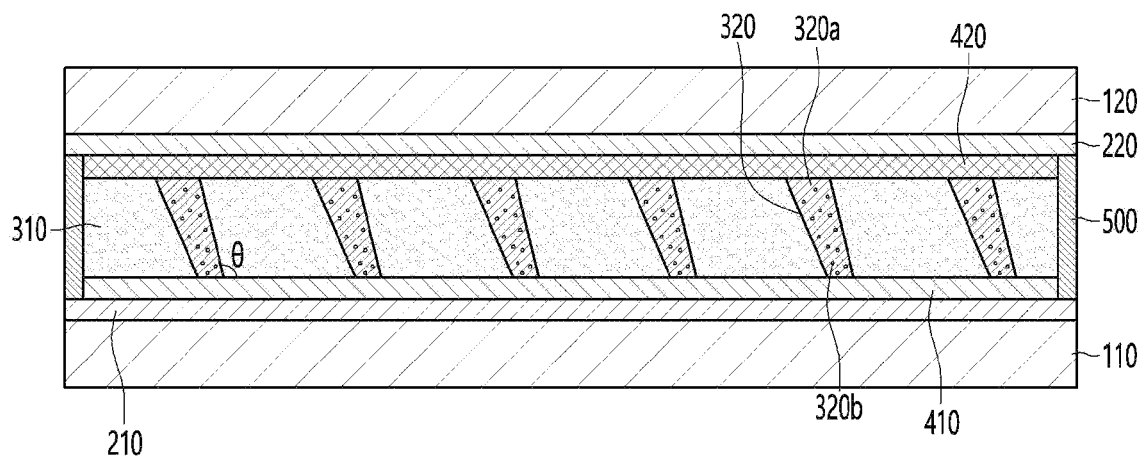

In addition, referring to FIGS. 12 and 13, in the light route control member according to the embodiment, unlike FIGS. 4 and 5, the receiving part 320 may be disposed while having a constant inclination angle θ.

In detail, referring to FIGS. 12 and 13, the receiving part 320 may be disposed with an inclination angle θ of greater than 0° to less than 90° with respect to the first electrode 210. In detail, the receiving part 320 may extend upwardly while having an inclination angle θ of greater than 0° to less than 90° with respect to one surface of the first electrode 210.

Accordingly, when the light route member is used together with the display panel, moire caused by the overlapping between the pattern of the display panel and the receiving part 320 of the light route member may be inhibited, thereby improving user visibility.

Hereinafter, a light path control member according to another embodiment will be described with reference to FIGS. 14 to 22. In the description of the light route control member according to another embodiment, descriptions that are similar to those of the light route control member according to the above-described embodiment will be omitted, and the same reference numerals will be given to the same components.

Figure 14:
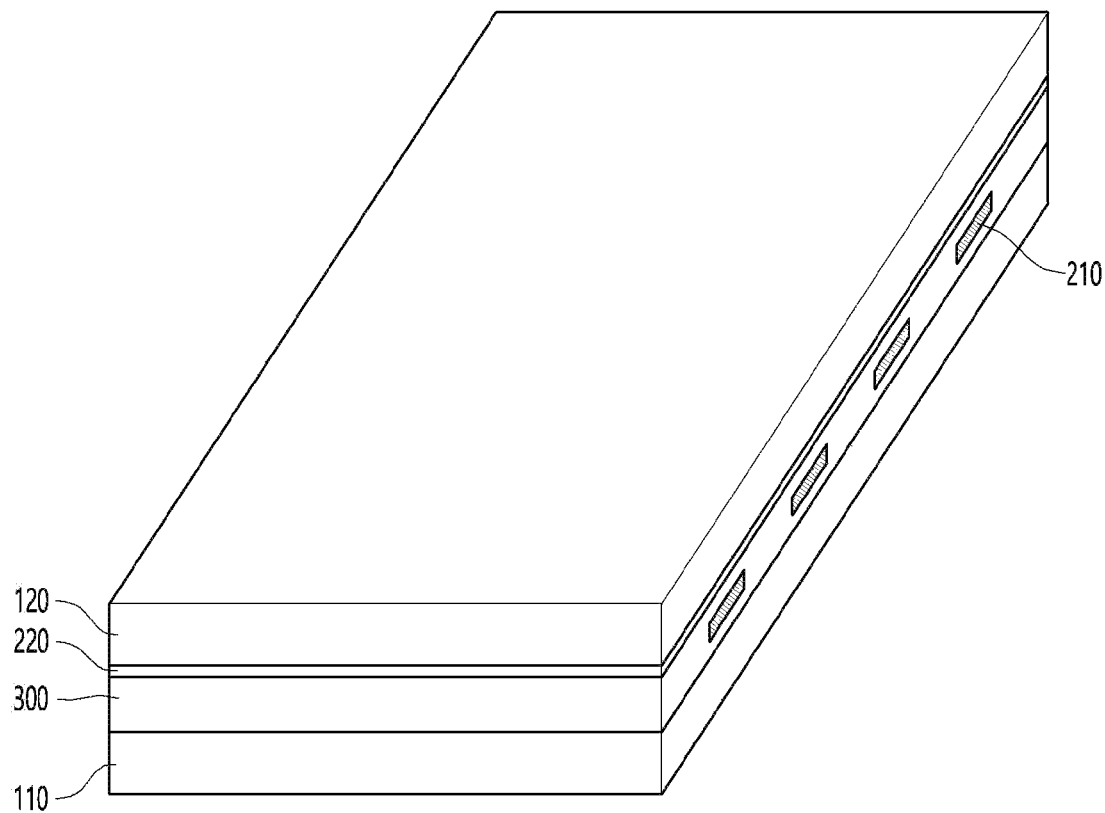
FIG. 14 is a view showing perspective view of a light route control member according to another embodiment.
Figure 15:
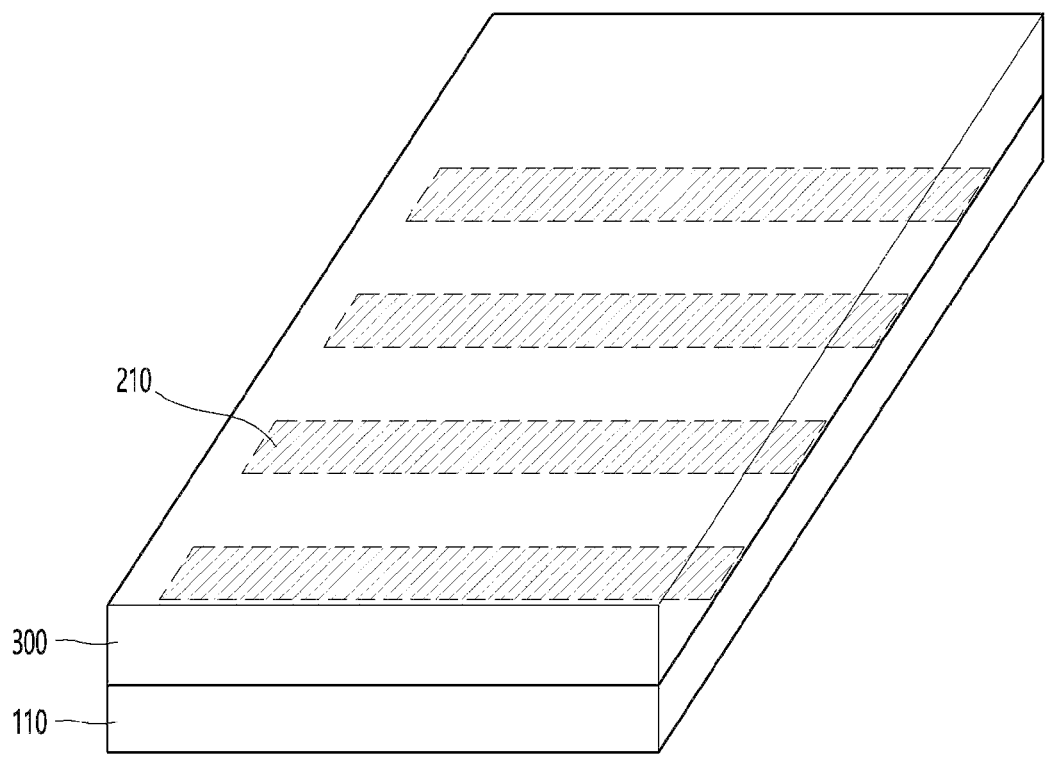
FIGS. 15 and 16 are views showing perspective views of a first substrate and a first electrode and a perspective view of a second substrate and a second electrode of the light route control member according to another embodiment, respectively.
Figure 16:
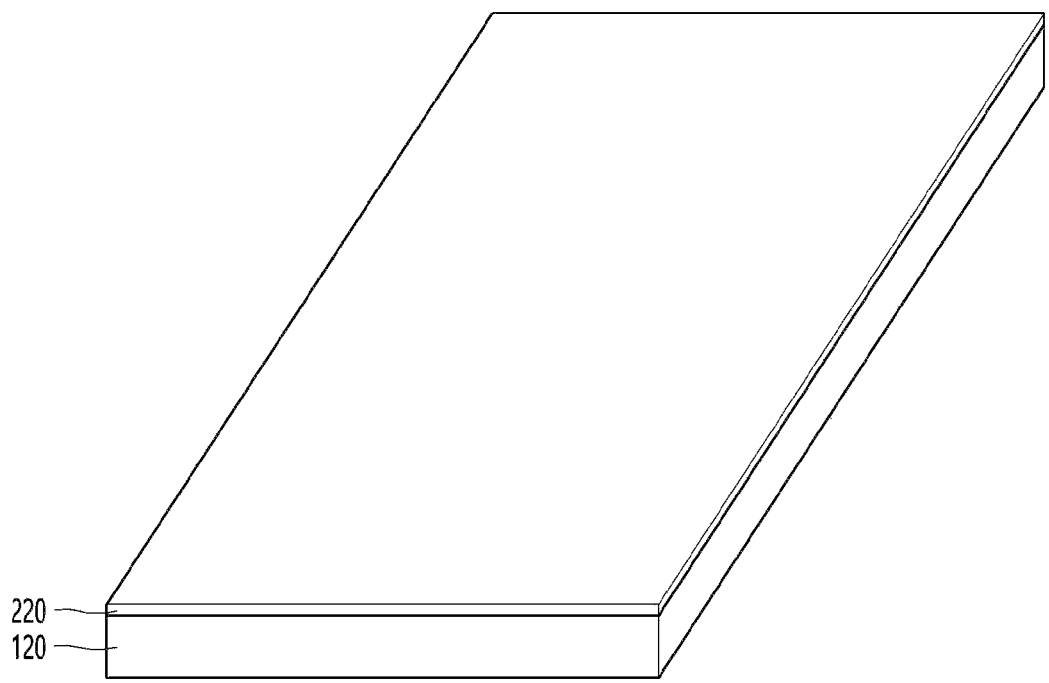

Referring to FIGS. 14 to 16, in the light route control member according to another embodiment, the first electrode 210 may be disposed inside the light conversion part 300. In detail, the first electrode 210 may be disposed to be embedded in the light conversion part disposed on the first substrate 110.

Figure 17:
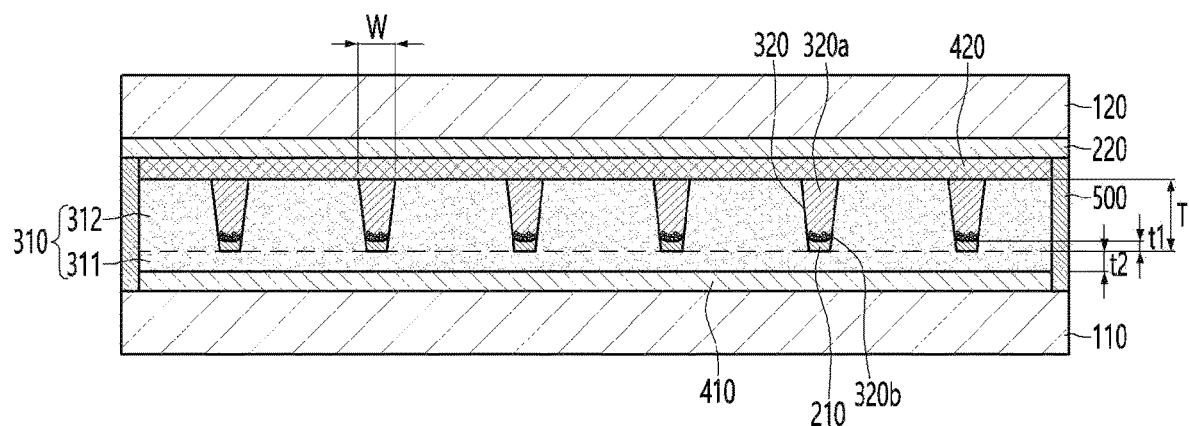
FIGS. 17 and 18 are views showing cross-sectional views of the light route control member according to another embodiment.
Figure 18:
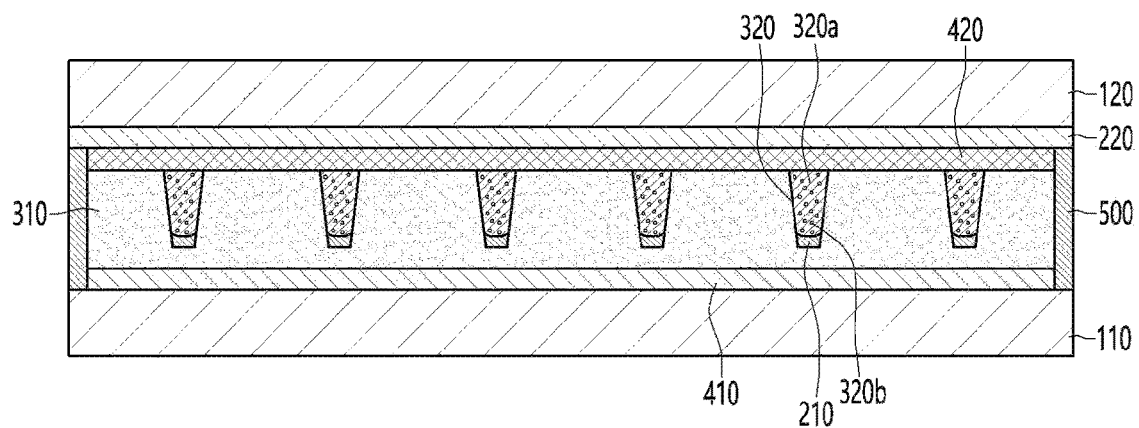

Referring to FIGS. 17 and 18, the first electrode 210 may include a plurality of electrode parts, and each electrode part may be disposed inside each receiving part 320.

That is, the first electrode 210 may be disposed inside the receiving part 320 and extend in the same direction as the extending direction of the receiving part 320.

Accordingly, the receiving part 320 may be in direct contact with the first electrode 210. That is, the dispersion 320a in which the light conversion particles 320b disposed inside the receiving part 320 are dispersed may be in direct contact with the first electrode 210.

The first electrode 210 may be formed of a metal paste including conductive particles. In detail, the first electrode 210 may be formed by filling and curing the metal paste inside the receiving part 320.

For example, the metal paste forming the first electrode 210 may include conductive particles and an organic material.

The conductive particles may include a metal. For example, the conductive particles may include silver particles. The conductive particles may be formed in a spherical shape.

The conductive particles may have a particle diameter of 1 μm or less. In detail, the particle diameter of the conductive particles may be in the range of 0.05 μm to 1 μm. When the particle diameter of the conductive particles is less than 0.05 μm, a shape in which the conductive particles are aggregated in the binder may occur. And, when the particle diameter of the conductive particles exceeds 1 µm, filling characteristics may be reduced when the metal paste is filled into the receiving part.

In addition, the particle diameter of the conductive particles may be less than or equal to the width w of the receiving part. Here, the width w of the receiving part may be defined as a long width among the widths of the receiving part having a long width and a short width.

In detail, the particle diameter of the conductive particles may be 0.01 times to 0.2 times the size of the width w of the receiving part.

When the particle diameter of the conductive particles is less than 0.01 times the width w of the receiving part, when the metal paste is filled into the receiving part, since the size of the conductive particles is too small, the conductive particles may adhere to the inner surface of the receiving part while moving to the bottom surface of the receiving part. As a result, the number of conductive particles in the first electrode disposed on the bottom surface of the receiving part may be reduced, so that conductivity may be reduced.

In addition, when the particle diameter of the conductive particles exceeds 0.2 times the width w of the receiving part, when the metal paste is filled into the receiving part, since the size of the conductive particles is too large, the conductive particles may be fixed in the middle of the receiving part without moving to the bottom surface of the receiving part. As a result, the number of conductive particles in the first electrode disposed on the bottom surface of the receiving part may be reduced, so that conductivity may be reduced.

The conductive particles and the organic material may be included in a constant weight %, respectively. The organic material may include a binder, a curing agent, and other additives.

In detail, the conductive particles may be included in an amount of about 60 wt % to about 85 wt % based on the total weight of the metal paste. When the conductive particles are included in an amount of less than about 60% by weight based on the total amount of the metal paste, the conductivity of the first electrode formed by the metal paste may be reduced. And, when the conductive particles are included in an amount exceeding about 85% by weight based on the total weight of the metal paste, the viscosity of the metal paste may increase, and thus, when the metal paste is filled into the receiving part, the filling characteristics may be reduced.

The binder and the organic material of the additive may be included in an amount of about 15 wt % to about 40 wt % based on the total weight of the metal paste.

The binder may be included in an amount of 40% to 50% by weight based on the entire organic material, the curing agent may be included in an amount of 30% to 40% by weight based on the entire organic material, and the additive may be included in an amount of 10% to 30% by weight based on the entire organic material.

The binder is a main material for forming the adhesive force of the first electrode formed by the metal paste, and may include a polymer material such as epoxy, ethyl cellulose, or acrylate.

In addition, the curing agent is included to cure the metal paste, and may include at least one of an Acid anhydride, an Amine, a Phenol, and a Thiol as a polymer for curing.

In addition, the additive may include a dispersing agent for dispersing the metal paste and a thixotropic additive for imparting thixotropic properties.

The first electrode 210 may include a plurality of pores. In detail, a plurality of pores may be formed in the first electrode 210 formed by curing the metal paste.

The porosity of the first electrode 210 may be 5% to 45%. Making the porosity of the first electrode 210 less than 5% may be difficult to implement in the process. In addition, when the porosity of the first electrode 210 exceeds 45%, the dispersion or light conversion particles inside the receiving part may penetrate between the pores, and the adhesion of the first electrode 210 may be reduced.

When the porosity of the first electrode 210 is satisfied in the range of 5% to 45%, the interface specific surface area of the first electrode 210 and the dispersion disposed on the first electrode 210 is increased to increase the electric field can be efficiently formed, and the driving characteristics of the light route control member can be improved.

Meanwhile, the metal paste forming the first electrode 210 may include conductive particles having different particle diameters to satisfy the porosity of the first electrode 210. In detail, the metal paste may include first conductive particles having a particle diameter of 0.5 µm to 1.5 µm and second conductive particles having a particle diameter of 6.5 µm to 7.5 µm, and the first conductive particles may be included in an amount of 25 wt % to 35 wt % with respect to the entire conductive particle, and the second conductive particle may be included in an amount of 65 wt % to 75 wt % based on the entire conductive particle.

Accordingly, the porosity of the first electrode 210 formed by the metal paste by the first and second conductive particles included in different particle sizes and in different amounts as described above is realized to be 5% to 45%. Accordingly, adhesive properties and driving properties can be improved.

The first electrode 210 may be formed to have a thickness smaller than a thickness T of the receiving part 320 inside the receiving part 320. Here, the thickness t1 of the first electrode 210 may be defined as the minimum thickness of the first electrode 210. In detail, since the first electrode 210 is formed so that the upper surface of the first electrode 210 is convex in the direction of the bottom surface of the receiving part inside the receiving part, the thickness t1 of the first electrode 210 may have a minimum thickness and a maximum thickness.

The thickness t1 of the first electrode 210 described below may be defined as the minimum thickness of the first electrode 210 that is the center of the convex surface of the first electrode 210.

In detail, the thickness t1 of the first electrode 210 may be 5% to 20% of the thickness T of the receiving part 320. For example, the thickness t1 of the first electrode 210 may be 5 µm to 20 µm.

When the thickness t1 of the first electrode 210 is less than 5% of the thickness T of the receiving part 320, the conductivity of the first electrode 210 may be reduced, and thus driving characteristics of the light route control member may be reduced. In addition, when the thickness t1 of the first electrode 210 exceeds 20% of the thickness T of the receiving part 320, when the light route control member passes through the light conversion unit 300, the movement of light is inhibited by the first electrode 210, so that the light transmittance of the light route control member in the second mode may be reduced.

Also, the thickness t1 of the first electrode 210 may be related to the width w of the receiving part 320. In detail, the aspect ratio between the thickness t1 of the first electrode 210 and the width w of the receiving part 320 may be 1.1 to 1.4.

By controlling the aspect ratio of the thickness t1 of the first electrode 210 and the width w of the receiving part 320 to 1:1 to 1:4, the conductivity of the first electrode 210 is secured, it is possible to improve the driving characteristics of the light route control member, and to minimize the interference of the movement of light by the first electrode 210 to secure the light transmittance of the light route control member in the second mode.

Meanwhile, the first electrodes 210 disposed in the respective receiving parts may have the same or similar thickness to each other.

In detail, the thickness difference between the plurality of first electrodes 210 disposed in each of the receiving parts may be 5% to 30% of the average thickness of the first electrodes 210. It is difficult to implement in a process that the thickness difference of the plurality of first electrodes 210 is less than 5% of the average thickness of the first electrodes 210, and when the thickness difference of the plurality of first electrodes 210 exceeds 30% of the average thickness of the first electrodes 210, due to a difference in the thickness of the first electrode disposed in each receiving part, conductivity in each receiving part is different. Accordingly, the overall driving characteristics of the light route control member may be reduced due to a difference in driving speed of each receiving part.

In the light route control member according to another embodiment, the first electrode for applying a voltage to the receiving part may be disposed inside the receiving part rather than outside the receiving part.

Accordingly, the dispersion in which the light conversion particles are dispersed in the receiving part may be disposed in direct contact with the first electrode. Accordingly, since the distance difference between the dispersion and the first electrode is eliminated, the voltage applied from the first electrode is directly transferred to the dispersion, thereby improving the driving speed of the light route control member.

Conventionally, the first electrode is disposed outside the receiving part, and accordingly, the dispersion in the receiving part and the first electrode are disposed to be spaced apart by the thickness of the base partition wall part.

Accordingly, since the base partition wall part has a dielectric characteristic of a certain size, there is a limitation in the selection of materials for the partition wall part. Also, when the thickness of the base partition wall part increases, the movement speed of the voltage applied from the first electrode to the receiving part is reduced, and thus the thickness of the base partition wall part is limited.

However, in the light path control member according to another embodiment, the difference in the distance between the dispersion and the first electrode may be eliminated by patterning and disposing the first electrode inside the receiving part. Thereby, the driving speed of the light route control member can be improved. In addition, since there is no restriction on the dielectric properties of the base partition wall part, the material of the partition wall part can be freely selected. In addition, by increasing the thickness of the base partition wall part, it is possible to secure the support force of the partition wall part. Thereby, the reliability of the light route control member can be improved.

In detail, the thickness t2 of the base partition wall part 311 may be about 5 μm to 35 μm. Accordingly, since it is possible to form the thickness t2 of the base partition wall part 311 to a thickness greater than that of the prior art, the strength of the base partition wall part 311 can be improved, thereby improving the supporting force of the partition wall part.

In addition, by controlling the composition and composition ratio of the metal paste forming the first electrode and the particle diameter of the conductive particles, it is possible to secure the filling and adhesion properties of the first electrode, and by making the thicknesses of the plurality of first electrodes disposed in the plurality of receiving parts uniform, a difference in driving speed of each receiving part may be minimized, and driving characteristics of the light route control member may be improved.

In addition, since the partition wall part including a resin material is bonded to a substrate including a resin material rather than an electrode including a metal material, that is, the first partition wall part, which is the light conversion part or the base partition wall part, is in direct contact with the first substrate. Therefore, it is possible to improve the adhesion between the light conversion part and the substrate.

Hereinafter, referring to FIGS. 19 to 23, a display device and a display apparatus to which the light route control member according to an embodiment is applied will be described.

Figure 19:
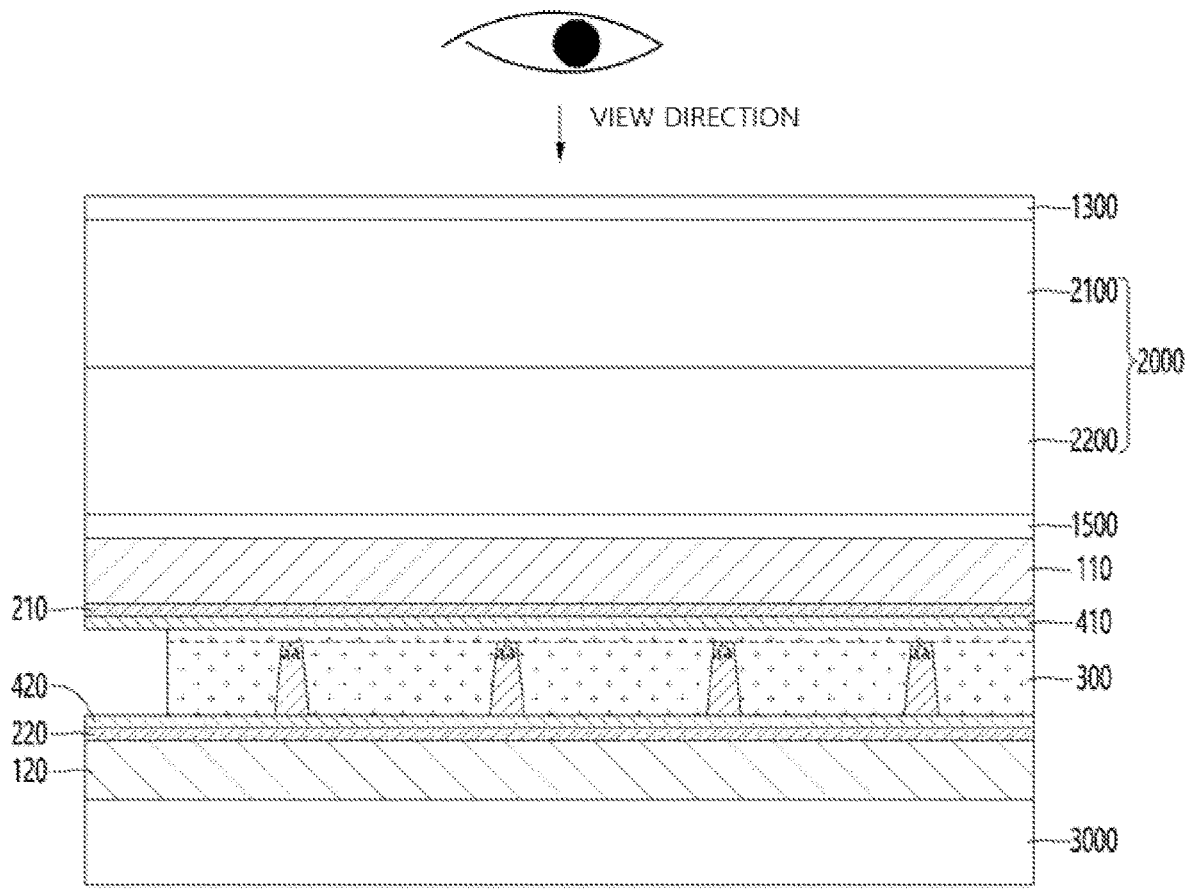
FIGS. 19 and 20 are views showing cross-sectional views of a display device to which a light route control member according to an embodiment is applied.
Figure 20:
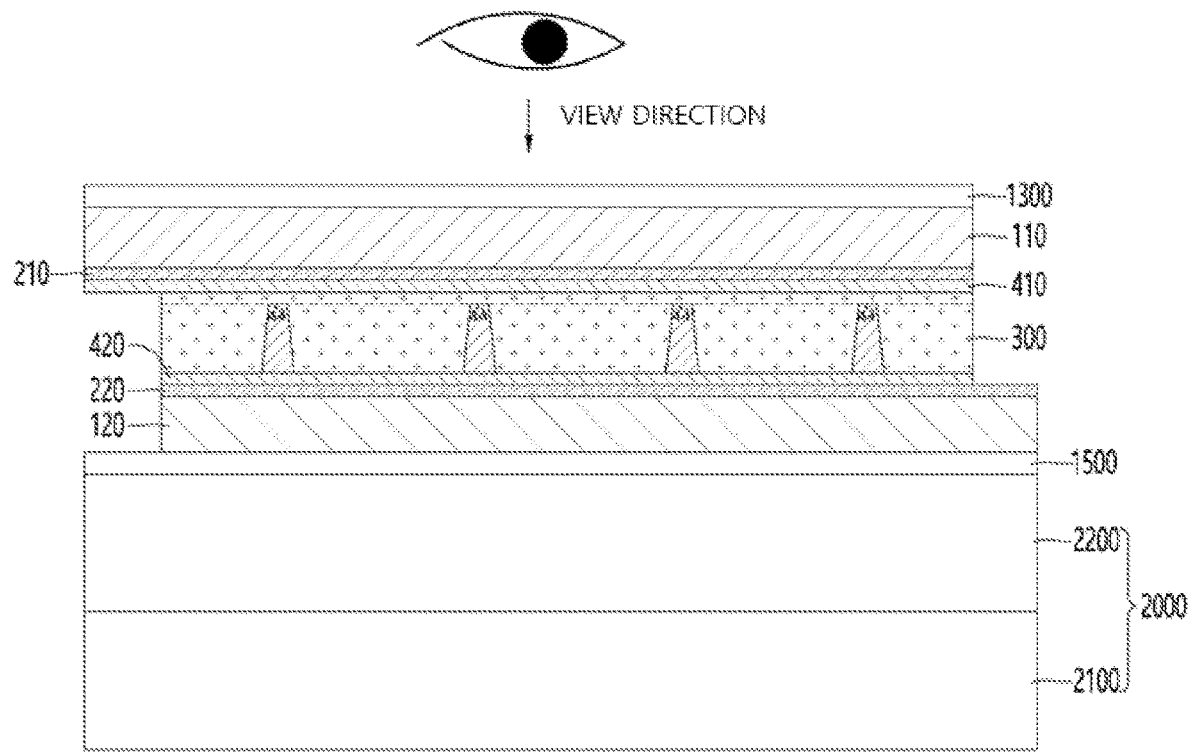

Referring to FIGS. 19 and 20, the light route control member 1000 according to an embodiment may be disposed on or under display panel 2000.

The display panel 2000 and the light route control member 1000 may be disposed to be adhered to each other. For example, the display panel 2000 and the light route control member 1000 may be adhered to each other via an adhesive layer 1500. The adhesive layer 1500 may be transparent. For example, the adhesive layer 1500 may include an adhesive or an adhesive layer containing an optical transparent adhesive material.

The adhesive layer 1500 may include a release film. In detail, when adhering the light route control member and the display panel, the light route control member and the display panel may be adhered after the release film is removed.

Meanwhile, referring to FIGS. 19 and 20, one end or one end and the other end of the light route control member may protrude, and the light conversion part may not be disposed on the protruding portion. The protrusion region is an electrode connection portion, and may connect an external printed circuit board and the light route control member through the electrode connection portion.

The display panel 2000 may include a first substrate 2100 and a second substrate 2200. When the display panel 2000 is a liquid crystal display panel, the light route control member may be formed under the liquid crystal panel. That is, when the user-viewed side of the liquid crystal panel is defined as the upper portion of the liquid crystal panel, the light route control member may be disposed under the liquid crystal panel. The display panel 2000 may be formed in a structure in which the first substrate 2100 including a thin film transistor (TFT) and a pixel electrode and the second substrate 2200 including color filter layers are bonded with a liquid crystal layer interposed therebetween.

In addition, the display panel 2000 may be a liquid crystal display panel of a color filter on transistor (COT) structure in which a thin film transistor, a color filter, and a black matrix are formed at the first substrate 2100 and the second substrate 2200 is bonded to the first substrate 2100 with the liquid crystal layer interposed therebetween. That is, a thin film transistor may be formed on the first substrate 2100, a protective film may be formed on the thin film transistor, and a color filter layer may be formed on the protective film. In addition, a pixel electrode in contact with the thin film transistor may be formed on the first substrate 2100. At this point, in order to improve an aperture ratio and simplify a masking process, the black matrix may be omitted, and a common electrode may be formed to function as the black matrix.

In addition, when the display panel 2000 is the liquid crystal display panel, the display device may further include a backlight unit providing light from a rear surface of the display panel 2000.

That is, as shown in FIG. 19, the light route control member is disposed below the liquid crystal panel and above the backlight unit 3000, and the light route control member may be disposed between the backlight unit 3000 and the display panel 2000.

Alternatively, as shown in FIG. 20, when the display panel 2000 is an organic light emitting diode panel, the light route control member may be formed on the organic light emitting diode panel. That is, when the surface viewed by the user of the organic light emitting diode panel is defined as the upper portion of the organic light emitting diode panel, the light route control member may be disposed on the organic light emitting diode panel. the display panel 2000 may include a self-luminous element that does not require a separate light source. In the display panel 2000, a thin film transistor may be formed on the first substrate 2100, and an organic light emitting element in contact with the thin film transistor may be formed. The organic light emitting element may include an anode, a cathode, and an organic light emitting layer formed between the anode and the cathode. Further, the second substrate 2200 configured to function as an encapsulation substrate for encapsulation may further be included on the organic light emitting element.

That is, the light emitted from the display panel 2000 or the backlight unit 3000 may move from the second substrate 120 of the light route control member to the first substrate 110.

Furthermore, although not shown in drawings, a polarizing plate may be further disposed between the light route control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting display panel, the polarizing plate may be the external light reflection preventive polarizing plate.

In addition, an additional functional layer 1300 such as an anti-reflection layer, an anti-glare, or the like may be further disposed on the light route control member 1000. Specifically, the functional layer 1300 may be adhered to one surface of first substrate 110 of the light route control member. Although not shown in drawings, the functional layer 1300 may be adhered to the first substrate 110 of the light route control member via an adhesive layer. In addition, a release film for protecting the functional layer may be further disposed on the functional layer 1300.

Further, a touch panel may be further disposed between the display panel and the light route control member.

Although it is shown in the drawings that the light route control member is disposed at an upper portion of the display panel, but the embodiment is not limited thereto, and the light route control member may be disposed at various positions such as a position in which light is adjustable, that is, a lower portion of the display panel, between a second substrate and a first substrate of the display panel, or the like.

In addition, in the drawings, the light conversion part of the light route control member according to the embodiment is shown in a direction parallel or perpendicular to the outer surface of the second substrate, but the light conversion part may be formed to be inclined at a predetermined angle from the outer surface of the second substrate. Accordingly, a moire phenomenon occurring between the display panel and the light route control member may be reduced.

Figure 21:
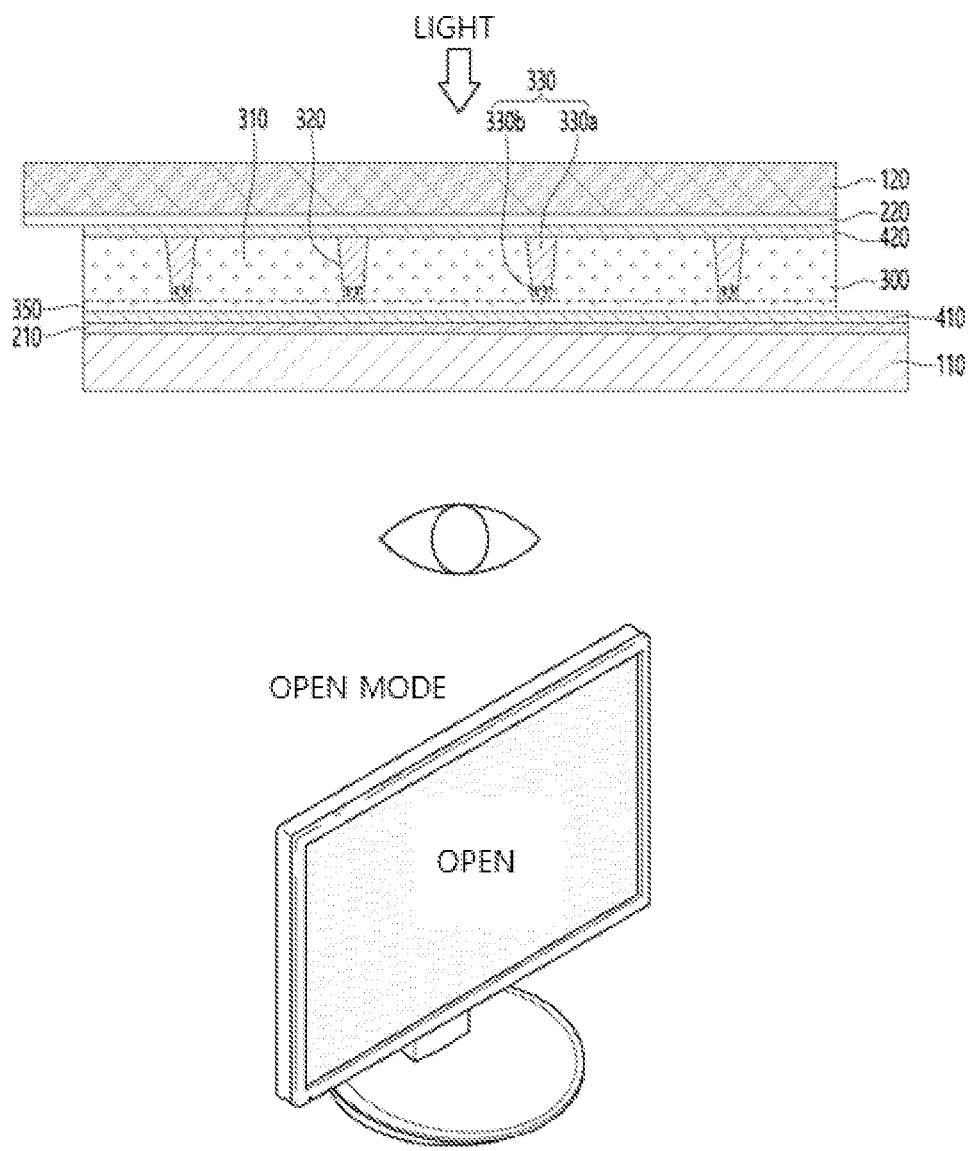
FIGS. 21 to 23 are views for describing one embodiment of the display device to which the light route control member according to the embodiment is applied.
Figure 22:
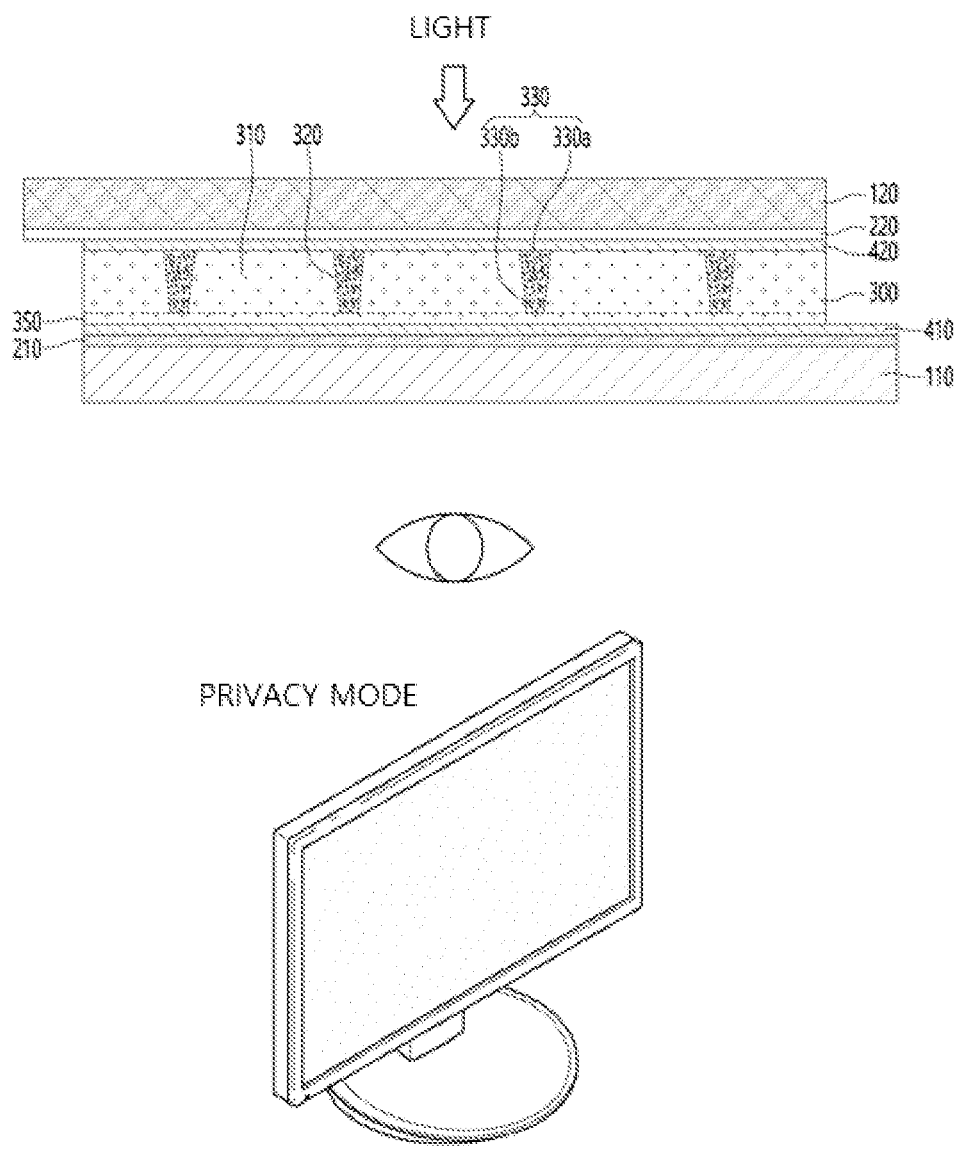
Figure 23:
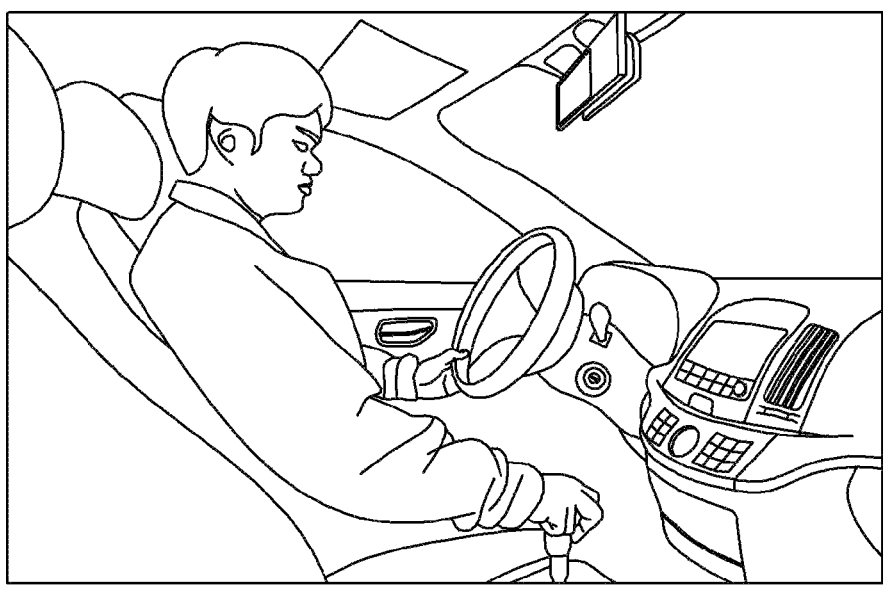

Referring to FIGS. 21 to 23, the light route control member according to the embodiment may be applied to various display devices.

Referring to FIGS. 21 to 23, the light route control member according to the embodiment may be applied to a display device that displays a display.

For example, when power is not applied to the light route control member as shown in FIG. 21, the receiving unit functions as the light blocking part, so that the display device is driven in a light blocking mode, and when power is applied to the light route control member as shown in FIG. 22, the receiving unit functions as the light transmitting part, so that the display device may be driven in an open mode.

Accordingly, a user may easily drive the display device in a privacy mode or a normal mode according to application of power.

The light emitted from the backlight unit or the self-luminous device may move from the first substrate to the second substrate. Alternatively, the light emitted from the backlight unit or the self-luminous device may also move from the second substrate to the first substrate.

In addition, referring to FIG. 23, the display device to which the light route control member according to the embodiment is applied may also be applied inside the vehicle.

For example, the display device including the light route control member according to the embodiment may display a video confirming information of the vehicle and a movement route of the vehicle. The display device may be disposed between a driver seat and a passenger seat of the vehicle.

In addition, the light route control member according to the embodiment may be applied to a dashboard that displays a speed, an engine, an alarm signal, and the like of the vehicle.

Furthermore, the light route control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. A light route control member comprising:
a first substrate;
a first electrode disposed on the first substrate;
a second substrate disposed on the first substrate;

a second electrode disposed under the second substrate; and a light conversion part disposed between the first electrode and the second electrode, wherein the light conversion part includes a partition wall part and a receiving part that are alternately arranged, wherein a light transmittance is changed according to an application of voltage to the receiving part, wherein partition wall part includes a base partition wall part and a separation partition wall part, wherein a plurality of pores is disposed in at least one of the base partition wall part and the separation partition wall part, wherein each pore includes air, wherein a density per unit area of partition wall material of the separation partition wall part is smaller than a density per unit area of partition wall material of the base partition wall part.

2. The light route control member of claim 1, wherein a light emitted from a light source is transmitted to the first substrate and the second substrate, wherein the light moves from the second substrate to the first substrate.

3. The light route control member of claim 1, wherein the pores are disposed only in the separation partition wall part.

4. The light route control member of claim 3, wherein the pores are arranged at a porosity of 0.5% to 50% with respect to the total volume of the separation partition wall part.

5. The light route control member of claim 3, wherein the pores are arranged at a porosity of 0.1% to 25% with respect to the total volume of the partition wall part.

6. The light route control member of claim 1, wherein the pores are disposed in the base partition wall part and the separation partition wall part, wherein a volume per unit area of the pores of the base partition wall part is smaller than a volume per unit area of the pores of the separation partition wall part.

7. The light route control member of claim 3, wherein the volume of the pores decreases while extending from the separation partition wall part to the base partition wall part.

8. The light route control member of claim 1, wherein the separation partition wall part includes a first separation partition wall part in a direction close to the first substrate and a second separation partition wall part in a direction close to the second substrate, wherein the pores are disposed only in the second separation partition wall part.

9. The light route control member of claim 8, wherein the second separation partition wall part has a thickness of 20% to 50% of the total thickness of the separation partition wall part.

10. A display device comprising:
a display panel; and
a light route control member disposed on the display panel;
wherein the light route control member includes:
a first substrate;
a first electrode disposed on the first substrate;
a second substrate disposed on the first substrate;
a second electrode disposed under the second substrate; and a light conversion part disposed between the first electrode and the second electrode, wherein the light conversion part includes a partition wall part and a receiving part that are alternately arranged, wherein a light transmittance is changed according to an application of voltage to the receiving part, wherein partition wall part includes a base partition wall part and a separation partition wall part, wherein a plurality of pores is disposed in at least one of the base partition wall part and the separation partition wall part, wherein each pore includes air, wherein a density per unit area of partition wall material of the separation partition wall part is smaller than a density per unit area of partition wall material of the base partition wall part, wherein a width of the partition wall part decreases while extending from the base partition wall part in the direction of the separation partition wall part, and wherein a light emitted from the display panel moves from the separation partition wall part in a direction toward the base partition wall part.

11. The light route control member of claim 1, wherein the first electrode is disposed inside the receiving part.

12. The light route control member of claim 11, wherein the first electrode comprises a plurality of conductive particles, wherein particles of the plurality of conductive particles have a particle diameter of 0.05 μm to 1 μm.

13. The light route control member of claim 12, wherein the particle diameter of the conductive particles is 0.01 to 0.2 times a width of the receiving part.

14. The light route control member of claim 11, wherein the first electrode includes pores.

15. The light route control member of claim 14, wherein the porosity of the first electrode is 5% to 45%.

16. The light route control member of claim 14, wherein the first electrode comprises a first conductive particle and a second conductive particle, wherein the first conductive particle has a particle diameter of 0.5 μm to 1.5 μm, wherein the second conductive particle has a particle diameter of 6.5 μm to 7.5 μm.

17. The light route control member of claim 11, wherein a thickness of the first electrode is 5% to 20% of a thickness of the receiving part.

18. The light route control member of claim 11, wherein an aspect ratio of the thickness of the first electrode to a width of the receiving part is 1.1 to 1.4.

19. The light route control member of claim 11, wherein the receiving part includes a plurality of receiving parts, wherein a thickness difference between the first electrodes disposed in the plurality of receiving parts is 5% to 30% of an average thickness of the first electrodes.

20. The display device of claim 10, wherein light emitted from a light source is transmitted to the first substrate and the second substrate, wherein the light moves from the second substrate to the first substrate.

* * * * *